(12) United States Patent
Furukawa et al.

(10) Patent No.: US 8,796,674 B2
(45) Date of Patent: Aug. 5, 2014

(54) METHOD OF MANUFACTURING ORGANIC ELECTRONIC DEVICE, AND ORGANIC ELECTRONIC DEVICE

(75) Inventors: Shun Furukawa, Machida (JP); Tomoyuki Nakayama, Hino (JP); Hiroshi Ishidai, Hachioji (JP)

(73) Assignee: Konica Minolta Holdings, Inc. (JP)

( * ) Notice: Subject to any disclaimer, the term of this patent is extended or adjusted under 35 U.S.C. 154(b) by 129 days.

(21) Appl. No.: 13/578,671

(22) PCT Filed: Feb. 7, 2011

(86) PCT No.: PCT/JP2011/052483
§ 371 (c)(1),
(2), (4) Date: Aug. 13, 2012

(87) PCT Pub. No.: WO2011/102249
PCT Pub. Date: Aug. 25, 2011

(65) Prior Publication Data
US 2012/0319094 A1    Dec. 20, 2012

(30) Foreign Application Priority Data
Feb. 17, 2010  (JP) ................. 2010-032261

(51) Int. Cl.
*H01L 51/00*  (2006.01)
*H01L 51/50*  (2006.01)
(52) U.S. Cl.
CPC .......... *H01L 51/0072* (2013.01); *H01L 51/508* (2013.01); *H01L 51/0073* (2013.01); *H01L 51/0037* (2013.01)
USPC .............. 257/40; 257/E51.001; 257/E51.018; 257/E51.026; 257/E51.027; 438/34; 438/37; 438/46

(58) Field of Classification Search
None
See application file for complete search history.

(56) References Cited

U.S. PATENT DOCUMENTS

2004/0235209 A1    11/2004    Hasegawa et al.

FOREIGN PATENT DOCUMENTS

JP            11-74083 A       3/1999
(Continued)

OTHER PUBLICATIONS

International Search Report for International application No. PCT/JP2011/052483 mailing date of May 10, 2011 with English translation.

*Primary Examiner* — Yasser A Abdelaziez
(74) *Attorney, Agent, or Firm* — Cantor Colburn LLP

(57) ABSTRACT

Provided is a method of manufacturing an organic electronic device, wherein an organic electronic device that controls the injection and mobility of carriers in an organic charge transport layer thereof is manufactured by laminating organic layers comprising the same charge transportable organic compound, when manufacturing the organic electronic device with the coating method. In this method of manufacturing an organic electronic device, which comprises a pair of electrodes on a substrate, and at least an organic functional layer and an organic charge transport layer in between the electrodes, the organic charge transport layer is formed by, in the following order: 1) a process for forming a first organic layer by coating, on the organic functional layer, a first organic layer coating-liquid, containing a charge transportable organic compound; and 2) a process for forming a second organic layer by coating, on the first organic layer, a second organic layer coating-liquid containing the charge transportable organic compound and a metallic compound. The method of manufacturing an organic electronic device is further specified by sections 3), 4), and 5).

12 Claims, 4 Drawing Sheets

(56) References Cited

FOREIGN PATENT DOCUMENTS

| | | |
|---|---|---|
| JP | 2000-196140 A | 7/2000 |
| JP | 2001-237079 A | 8/2001 |
| JP | 2002-313583 A | 10/2002 |
| JP | 2005-72012 A | 3/2005 |
| JP | 2005-510034 A | 4/2005 |
| JP | 2007-42314 A | 2/2007 |
| JP | 2009-43612 A | 2/2009 |
| JP | 2009-76241 A | 4/2009 |
| JP | 2009-152033 A | 7/2009 |
| WO | 2008/028611 A2 | 3/2008 |
| WO | 2009/060780 A1 | 5/2009 |

METHOD OF MANUFACTURING ORGANIC ELECTRONIC DEVICE, AND ORGANIC ELECTRONIC DEVICE

CROSS REFERENCE TO RELATED APPLICATIONS

This is a U.S. national stage of application No. PCT/JP2011/052483, filed on 7 Feb. 2011. Priority under 35 U.S.C. §119(a) and 35 U.S.C. §365(b) is claimed from Japanese Application No. 2010-032261, filed 17 Feb. 2010, the disclosure of which are also incorporated herein by reference.

TECHNICAL FIELD

The present invention relates to a manufacturing method of an organic electronic device and an organic electronic device.

TECHNICAL BACKGROUND

Electroluminescent displays are used as light emitting type electronic display device (ELD). As the constituting element of the ELD, an inorganic electroluminescent element (inorganic EL element) and an organic electroluminescent device (organic EL device) are cited. The inorganic EL device has been used as a planar light source though high alternative voltage is required for driving such the light emitting device.

The organic EL device is an element having a light emission layer placed between a cathode and an anode, in which electrons and holes are injected into the light emission layer and excitons are generated by recombination of them, and light (fluorescence or phosphorescence) is emitted on the occasion of quenching of the excitons. Such the device is noted because which can emit light by application of a voltage of several to several tens volts, and has wide viewing angle and high visibility since it is a self light emission type, and is completely solid state thin device suitable for space saving and portable appliance.

It is important character of the organic EL device that the element is a planar light source different from ordinary practically used principal light sources such as light emission diodes and cold cathode ray tubes. As the use for effectively utilizing such the character, illuminating light source and backlight for various displays are cited. Particularly, such the element is suitably used for the backlight of liquid crystal full color display which is strongly demanded in recent years.

An improvement of light emission efficiency is required to utilize the organic EL element practically in illuminating light source or backlight for display. Function-separation has become general so that an organic functional layer composing the organic EL element is composed of plural layers each having individual functional materials, or, is composed of mixture of the materials to improve the light emission efficiency.

Manufacturing method of an organic EL element include an evaporation method, a wet process such as a spin coat method, a cast method, a die coat method, an inkjet method, a spray method and a printing method, (hereafter referred to a coating method), and the manufacturing method via wet process is marked recently since continuous production is easily conducted without using a process in a vacuum.

However, in case of the organic EL element manufactured via wet process there is restriction particularly superposing same compounds in layers such as scraping out or washing out of the lower layer in the coating method in comparison with so called evaporation method. Therefore, function-separation is not attained in case of manufacturing the organic electronic device such as an organic EL element in comparison with the evaporation method.

An idea is proposed to provide an electron transportable hole block layer between an electron transport layer and a light emission layer, effects to trap a hole within light emission layer appears, and as its result recombination probability between hole and an electron is improved to enhance a light emission efficiency as a means for improving Performance of an organic EL element in an organic EL element (for example, Patent Document 1).

An idea is proposed to form a concentration gradient in a thickness direction by mixing electron injection martial with electron transportable material, and carrier injection performance between layers is enhanced to reduce power consumption of the device as well as to elongate life time (for example, Patent Document 2).

However, these can be easily produced via an evaporation method, it is impossible to form plural layers containing a common compound using the same solvent via a coating method since the lower layer is dissolved. Further it is difficult to control so as to give gradient of mixture ratio of plural materials in a thickness direction.

To dissolve the problems, an idea is proposed in which mixture area of certain functional layer is provided in at least two layers among organic layers, and at least one composing component has continuous concentration gradient in concentration distribution whereby element having a high light emission efficiency, low driving voltage and further long emission life time via a coating method (for example, Patent Documents 3 and 4).

However, there is a problem not to applied means to form plural layers using same compound since these are utilized the difference of solubility of material between two adjacent layers in this instance. Further it is possible to relaxing the barrier at the interface by continuously mixing the component between two layers, on the other side it reduces block function of carrier or exciton, and therefore it is difficult to attain performance similar to evaporation method.

PRIOR ART DOCUMENT

Patent Document

Patent Document 1: JP-A 2001-237079
Patent Document 2: JP-A 2002-313583
Patent Document 3: JP-A H11-074083
Patent Document 4: JP-A 2007-042314

SUMMARY

Problems to Dissolve by the Invention

The present invention is performed in view of the above described problems, and the object of the invention is to provide a manufacturing method of an organic electronic device, when manufacturing the organic electronic device with the coating method by laminating organic layers comprising the same charge transportable organic compound, an organic electronic device that controls the injection and mobility of carriers in an organic charge transport layer thereof, and to provide an organic electronic device.

Means to Dissolve the Problems

The above described problems in relation to the invention are dissolved by technical aspects described below.

1. A manufacturing method of an organic electronic device having a pair of electrodes on a substrate, and at least an organic functional layer and an organic charge transport layer between the electrodes wherein the organic charge transport layer comprises a first organic layer and a second organic layer, which comprises 1) a process for forming a first organic layer by coating, on the organic functional layer, a first organic layer coating-liquid containing a charge transportable organic compound; and 2) a process for forming a second organic layer by coating, on the first organic layer, a second organic layer coating-liquid containing the charge transportable organic compound and a metallic compound, in this order, wherein 3) 80% by mass or more of the charge transportable organic compound in each of the first organic layer and the second organic layer, respectively, is the same compound, 4) content of the metallic compound contained in the second organic coating-liquid is 20 to 40% by mass based on sum of content of the charge transportable organic compound and content of the metallic compound contained in the second organic layer coating-liquid, and, 5) the process for forming a second organic layer by coating the second organic layer coating-liquid is conducted at a temperature of 5 to 15° C. higher than melting point of a solvent used in the second organic layer coating-liquid.

2. The manufacturing method of the organic electronic device described in aspect 1., wherein drying process is conducted after forming the first organic layer by coating the first organic layer coating-liquid.

3. The manufacturing method of the organic electronic device described in aspect 2., wherein drying process is hearing process at a temperature of 5 to 10° C. lower than a glass transition point of the charge transportable organic compound.

4. The manufacturing method of the organic electronic device described in any one of aspects 1 to 3., wherein the charge transportable organic compound is a compound represented by Formula (1) described below.

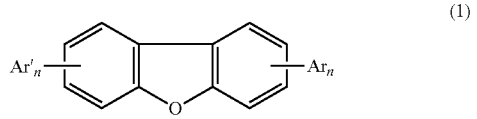

(1)

In Formula (1) described above, Ar and Ar' represent independently an aromatic ring, and n represents an integer of 0 to 8.

5. The manufacturing method of the organic electronic device described in any one of aspects 1 to 4., wherein the metallic compound is alkali metal salt.

6. The manufacturing method of the organic electronic device described in any one of aspects 1 to 5., wherein the metallic compound is the metallic compound is potassium salt.

7. The manufacturing method of the organic electronic device described in any one of aspects 1 to 6., wherein solvent of the first organic layer coating-liquid or the second organic layer coating-liquid is fluorinated alcohol.

8. The manufacturing method of the organic electronic device described in any one of aspects 1 to 7., wherein sum of the content of the organic compound and metallic compound in the second organic layer coating-liquid is 0.1 to 3.0 mass %.

9. The manufacturing method of the organic electronic device described in any one of aspects 1 to 8., wherein the organic charge transport layer has a concentration gradient of the metallic compound in the thickness direction.

10. The manufacturing method of the organic electronic device described in any one of aspects 1 to 9., wherein the organic charge transport layer is an electron transport layer.

11. The manufacturing method of the organic electronic device described in any one of aspects 1 to 10., wherein the organic functional layer is an organic electroluminescence layer.

12. An organic electronic device manufactured by the manufacturing method of the organic electronic device described in any one of aspects 1 to 11.

Effect of the Invention

A manufacturing method of an organic electronic device is provided by laminating organic layers comprising the same charge transportable organic compound, an organic electronic device that controls the injection and mobility of carriers in an organic charge transport layer thereof when manufacturing the organic electronic device with the coating method, as well as an organic electronic device is provided by the invention.

EMBODIMENTS PRACTICING THE INVENTION

Figure 1:
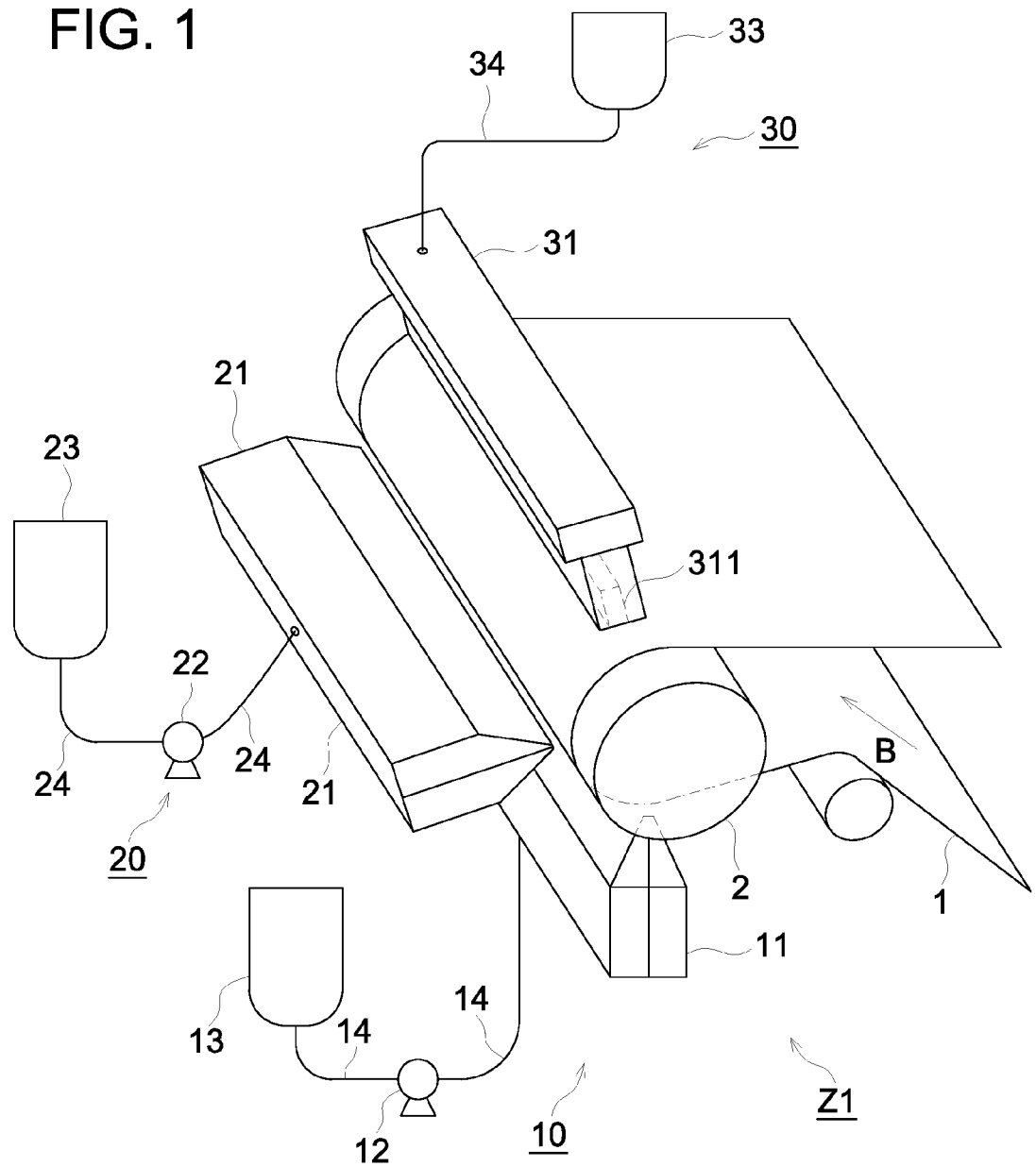
FIG. 1: A schematic drawing illustrating an example of a coating apparatus used in the manufacturing method of an organic electronic device of the invention.

Embodiments practicing the invention are described below. The invention is not restricted to these.

A manufacturing method of an organic electronic device, in which carrier injection and carrier mobility are controlled and diffusion of a metallic compound to an organic functional layer is inhibited, that has not been realized by a coating method hereto, as well as an organic electronic device, are provided by the embodiment described in any one of claims 1 to 12, according to this invention.

Each of the elements according to the invention is detailed below.

The manufacturing method of an organic electronic device of the invention to manufacture the organic electronic device having a pair of electrodes on a substrate, and at least an organic functional layer and an organic charge transport layer between the electrodes, in which the organic charge transport layer is formed by 1) a process for forming a first organic layer by coating, on the organic functional layer, a first organic layer coating-liquid, containing a charge transportable organic compound, and 2) a process for forming a second organic layer by coating, on the first organic layer, a second organic layer coating-liquid containing the charge transportable organic compound and a metallic compound, in this order, which is characterized by that 3) 80% by mass or more of the charge transportable organic compound in each of the first organic layer and the second organic layer, respectively, is the same compound, 4) content of the metallic compound contained in the second organic coating-liquid is 20 to 40% by mass based on sum of content of the charge transportable organic compound and content of the metallic compound contained in the second organic layer coating-liquid, and, 5) the process for forming a second organic layer by coating the second organic layer coating-liquid is conducted at a temperature of 5 to 15° C. higher than melting point of a solvent used in the second organic layer coating-liquid.

Organic Functional Layer

The organic functional layer according to this invention is a layer required to display the function at minimum in an organic electronic device, and includes, for example, light emission layer (an organic electroluminescence layer) emitting fluorescence light or phosphorescent light in an organic EL element (hereafter also is referred also to an organic EL element), and an electric generation layer generating charge in an organic solar cell element. The organic functional layer according to this invention includes a compound displaying function, such as low molecular weight material, high molecular weight material, a material having a polymerizable group such as a vinyl group and an epoxy group to make insoluble by polymerization after film forming, separation function by mixing plural material for enhancing performance, or a single material endowed with plural functions such as co-polymerized polymer. Further, the organic functional layer may be formed by an evaporation method or a coating method, it is preferable to manufacture by a coating method in view of appropriate production.

Organic Charge Transport Layer

The organic charge transport layer according to this invention is a layer transporting a charge carrier such as a hole and an electron from an electrode to an organic functional layer in the organic electronic device, or a layer transporting the charge carrier from an organic functional layer. The layer transporting mainly a hole from electrode between organic functional layers is called a hole transport layer, and a layer transporting mainly an electron is called an electron transport layer. The present invention can be applied to forming both a hole transport layer and an electron transport layer, and is preferably applied to forming the electron transport layer.

The organic charge transport layer is composed of at least the first organic layer and the second organic layer, and one of the feature is that 80% by mass or more of the charge transportable organic compound in each of the first organic layer and the second organic layer is the same compound, and preferably, 90% by mass or more is the same compound in this invention.

One of the features is that the content of the metallic compound contained in the second organic coating-liquid is 20 to 40% by mass based on sum of content of the charge transportable organic compound and content of the metallic compound contained in the second organic layer coating-liquid, and, the process for forming a second organic layer by coating the second organic layer coating-liquid is conducted at a temperature of 5 to 15° C. higher than melting point of a solvent used in the second organic layer coating-liquid when the organic charge transport layer, in this invention.

Further, it is preferable that the content of the metallic compound contained in a first organic layer (detected by secondary ion via mass spectroscopy) after forming the organic charge transport layer based on the sum of the content of the charge transportable organic compound and the content of the metallic compound (i.e., {a metallic compound/(charge transportable organic compound+a metallic compound)}× 100) is 0.1 to 10% by mass.

There are several way to detect the above described content of the metallic compound, the secondary ion mass spectroscopy (SIMS) can be used because the content within the layer is analyzed with high sensitivity and change of element content in the depth direction can be chased. "Secondary ion mass spectroscopy" (Selection of books of Surface Technologies) edited by The Surface Science Society of Japan published by Maruzen and the like can be referred as for the secondary ion mass spectroscopy.

In the secondary ion mass spectroscopy, ion beam called primary ion is irradiated to the sample surface in high vacuum condition around $10^{-8}$ Pa to conduct spattering. Elements on the surface are analyzed via mass spectroscopy of the secondary ion among the discharged composing particle. Though this is a destructive analysis to cut the surface by spattering, content change of the elements from the surface to depth in μm order can be analyzed.

Metallic ion species such as $Cs^+$, $In^+$, $Ga^+$, $O_2^+$ re preferable as the primary ion, and the preferable ion species can be selected according to the element to be detected.

Specifically, distribution content of the metal elements within an organic electronic device in a depth direction are measured by employing ADEPT 1010 manufactured by Physical Electronics Inc., with a positive ion detecting condition using $O_2^+$ as the primary ion species and primary ion accelerating voltage of 3 kV in this invention.

As a result of the earnest study it has been found that the first organic layer and the second organic layer are laminated without mixing homogeneously by conducting the coating process under the condition of lowering the solubility of the first organic layer, or lowering the diffusion property of the metallic compound contained in the second organic layer coating-liquid. In this invention, it is achieved by that the second organic layer coating-liquid is coated, and the process forming the second organic layer is conducted within a range of 5 to 15° C. higher than the melting point of the solvent used in the second organic layer coating-liquid.

Though the reason why the laminating characteristics are controlled, it is presumed below. Temperature of the surrounding during the coating process of the second organic layer is maintained low, permeation or diffusion rate of the metallic compound contained in the second organic layer coating-liquid to the first organic layer is lowered, or rate of re-dissolving the first organic layer in the second organic layer coating-liquid is lowered. Further, when the temperature during the coating exceeds 15° C. higher than melting point, it is not preferable since the first organic layer is dissolved in the second organic layer coating-liquid. On the other side, in a lower temperature surrounding than 5° C. higher than the melting point, it is not preferable since possibility of solidification of the coating-liquid is expected.

The process of forming the second organic layer by coating the second organic layer coating-liquid a second organic layer coating-liquid is conducted at a temperature of 5 to 15° C. higher than melting point. It is preferably 5 to 10° C. higher than the melting point.

It is preferable that a drying process is included after forming the first organic layer to obtain the similar effect to perform as above descried. Any drying methods may be used, for example, heat drying using such as a hot plate, oven, and infrared ray, blower drying by a dryer, and reduced pressure drying under vacuum pressure, or a combination of these, as far as the solvent within the layer is removed. Further, it is preferable to conduct the heating process at neighborhood of Tg of the charge transportable organic compound used in the organic charge transport layer, specifically preferably in the temperature range from 20° C. lower than Tg to 5° C. lower than Tg, more preferably, from 10° C. lower than Tg to 5° C. lower than Tg. Though it is not clear why the performance improves by conducting this process, it is presumed that, solubility of the first organic layer is lowered and diffusion of the metallic compound is restrained because charge transportable organic compound within the layer generate rearrangement by heating at a temperature of neighborhood of Tg of the charge transportable organic compound, and layer density is improved.

The charge transportable organic compound used in the organic charge transport layer of this invention may include any charge transportable organic compound as far as they have a charge transportable property, and the compounds represented by Formula (1) described above are preferable. It is supposed that this is because diffusion is inhibited by interaction between oxygen part of the dibenzofuran skeleton and metal ion dissociated in a solvent.

The metallic compound used in the invention is not particularly restricted as far as it can be dissolved in the coating solvent, and preferable example includes salt of alkali metal such as lithium, sodium, potassium, rubidium and cesium, and salt of alkali earth metal such as beryllium, magnesium, calcium, strontium and barium, and more preferably salt of alkali metal. The salt may be used both of inorganic salt and organic salt. The metallic compound is particularly preferably potassium salt.

Any solvents may be used in the invention as far as it does not contaminate with the organic functional layer, and since the metallic compound is relatively easy to dissolve, preferable is pure water and alcoholic solvents such as methanol, ethanol, normal-propanol, iso-propanol, normal-butanol, tert-butanol, 2,2,3,3-tetrafluoro propanol, 2,2,3,3,3-pentafluoro propanol, 1,1,1,3,3,3-phexafluoro isopropanol and 2,2,3,3,4,4,5,5-octafluoropentanol, more preferably fluorinated alcohols such as 2,2,3,3-tetrafluoro propanol, 2,2,3,3,3-pentafluoro propanol, and 1,1,1,3,3,3-phexafluoro isopropanol, 2,2,3,3,4,4,5,5-octafluoropentanol.

With reference to the concentration of coating-liquid such as the first organic layer coating-liquid or the second organic layer coating-liquid, coating-liquid is preferably dilute solution, since solution of a solid is an equilibrium phenomenon, and the lower the temperature of solution system is, the solving rate becomes lower as for dilute solution in general. Further concentration of coating-liquid is preferably 0.1 to 5% by mass in terms of sum of the organic compound and the metallic compound, and more preferably 0.1 to 3% by mass solution, since wet thickness formed during coating process is very large in comparison with the dry thickness after coated layer drying and it apt to cause uneven drying easily when the concentration of coating-liquid is too low.

It is possible to manufacture both a simple lamination composed of the first organic layer and the second organic layer and an adequately mixed layer in a degree of not being homogeneous by manufacturing the organic charge transport layer of this invention, it is more preferable to mix the first layer and the second layer adequately so as to manufacture a layer having gradient of the metallic compound content in a thickness direction, than to manufacture a simple lamination, in view of controlling carrier injection or carrier transportation.

The manufacturing method of an organic electronic device of the invention is a manufacturing method performed by finding a manufacturing method laminating layers containing the same compound that cannot manufacture by a known coating method.

Detail of each composing elements of an organic EL element are described in sequence as an example of the manufacturing method of an organic electronic device of the invention, however the present invention is not restricted to a manufacturing method of the organic EL element and may be applied to manufacturing laminated material of the organic compound in the manufacturing of an organic electronic device such as an organic solar cell element.

Layer Arrangement of Organic EL Element

Figure 4:
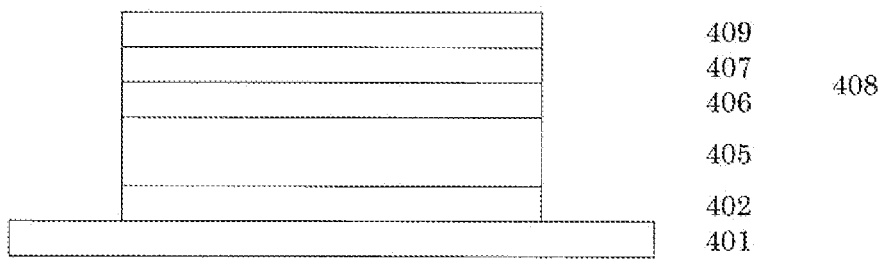
FIG. 4: A schematic plan of an example of an organic electronic device manufactured by the manufacturing method according to an embodiment of the present invention.

FIG. 4 demonstrates a schematic plan of an example of an organic electronic device manufactured by the manufacturing method according to an embodiment of the present invention. The device shown in FIG. 4 comprises a pair of electrodes 402 and 409, an organic functional layer 405, and an organic transport layer containing a first organic layer 406 and a second organic layer 407 on a substrate 401. Representative organic transport layer is an electron transport layer. The organic electronic device may further comprise a hole injection layer and a hole transport layer.

Preferable examples of a layer arrangement of the organic EL element according to this invention manufactured by the manufacturing method of an organic electronic device of the invention is listed below, however the invention is not restricted to these.

(i) Anode/Light emission layer/Electron transport layer/Electron transport layer/Cathode
(ii) Anode/Hole transport layer/Hole transport layer/Light emission layer/Electron transport layer/Cathode
(iii) Anode/Hole transport layer/Hole transport layer/Light emission layer/Electron transport layer/Electron transport layer/Cathode
(iv) Anode/Hole transport layer/Light emission layer/Hole block layer/Electron transport layer/Electron transport layer/Cathode
(v) Anode/Hole transport layer/Hole transport layer/Light emission layer/Hole block layer/Electron transport layer/Electron transport layer/Cathode
(vi) Anode/Hole transport layer/Light emission layer/Hole block layer/Electron transport layer/Electron transport layer/Cathode buffer layer/Cathode
(vii) Anode/Hole transport layer/Hole transport layer/Light emission layer/Hole block layer/Electron transport layer/Electron transport layer/Cathode buffer layer/Cathode
(viii) Anode/Anode buffer layer/Hole transport layer/Light emission layer/Hole block layer/Electron transport layer/Electron transport layer/Cathode buffer layer/Cathode
(ix) Anode/Anode buffer layer/Hole transport layer/Hole transport layer/Light emission layer/Hole block layer/Electron transport layer/Electron transport layer/Cathode buffer layer/Cathode Method for Forming Layers In the organic EL element of the invention, which is an example of the invention, the charge transport layer (which is called as an electron transport layer, or used preferably as a hole transport layer, preferably an electron transport layer) is required to be formed by a coating method, and the forming other layers are not particularly restricted to the layer forming method by coating, and may be formed via, for example, evaporation method.

However, a coating method (referred to film forming method by coating) is used for manufacturing the charge transport layer, which is a composing layer, in the manufacturing method of the organic EL element of this invention, particularly, a spin coat method, a cast method, an inkjet method, a spray method, a printing method and a slot type coater method are employed, and a coating method such as a spin coat method, an inkjet method, a spray method, a printing method or a slot type coater method is specifically preferable with respect to easy preparation of a homogeneous layer and scarce generation of pinholes.

It is preferable to use the above described coating method (film forming method by coating) for the other composing layer other than the charge transport layer of the organic EL element of this invention naturally.

With reference to a drying method after film forming by coating the method such as, spin drying hot wind drying, far infrared drying, vacuum drying and reduced pressure drying is applicable.

The method of forming the other composing layer than the organic charge transport layer of the organic EL element, which is an example of the invention, will be detailed in the items of manufacturing method of the organic EL element described later.

Light Emission Layer

The light emission layer is a layer in which electrons and holes each injected from the electrodes or the electron transfer layer and the hole transfer layer, respectively, are recombined to emit light and the portion of light emission may be inside of the layer or the interface of the light emission layer and the adjacent layer.

Though a thickness of the light emission layer is not particularly restricted, it is preferable to control within a range of 2 to 200 nm, and more preferably 5 nm to 100 nm, in view of uniformity of the formed layer, preventing applying unnecessary high potential at the emission time and improving emission light stability against driving current.

The light emission layer of the organic EL element preferably contains at least one of a light emission host and a light emission dopant in view of improvement of the light emission efficiency.

The light emission dopant and light emission host contained in the light emission layer are described.

Light Emission Host

As the host compound to be contained in the light emission layer of the organic EL device of this invention, a compound is preferable which has a phosphorescent quantum efficiency of the phosphorescent light emission of less than 0.1, and more preferably less than 0.01 at room temperature (25° C.). The weight ratio of the host compound in the compounds contained in the light emission layer is preferably not less than 20%.

The light emission host used in the invention is not particularly restricted and compound conventionally used as an organic EL element can be used, and the compound having hole transport ability, electron transport ability, as well as large excited triplet energy, and further high Tg (glass transition temperature) is preferable.

As the host compound, known host compounds may be used singly or in a combination of plural kinds thereof. The transfer of charge can be controlled by the combination use of the host compounds so as to raise the efficiency of the organic EL device. Moreover, mixing of different emitted light is made possible by the use of plural kinds of light emission material so as that optional color light can be obtained.

Further, an emission host may be either a low molecular weight compound or a polymer compound having a repeating unit, in addition to a low molecular weight compound having a polymerizing group such as a vinyl group and an epoxy group (a polymerizing emission host). One or more compounds of these may be used.

Examples of the light emission hosts are listed without limitation.

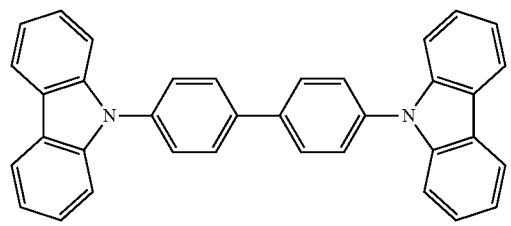

H-1

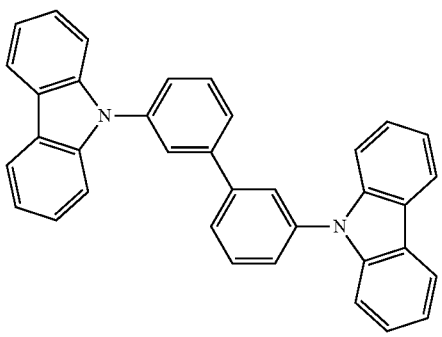

H-2

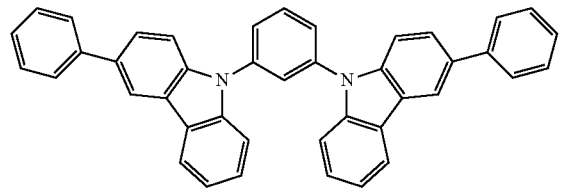

H-3

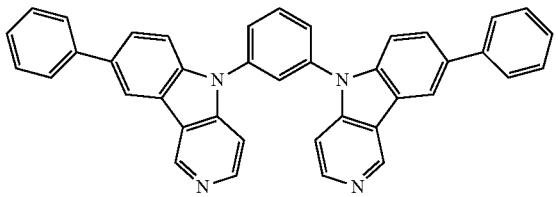

H-4

-continued
H-5
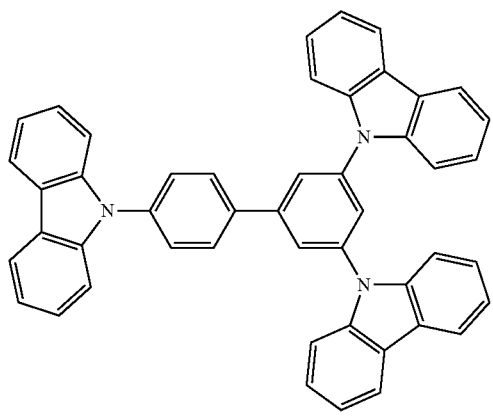
H-6
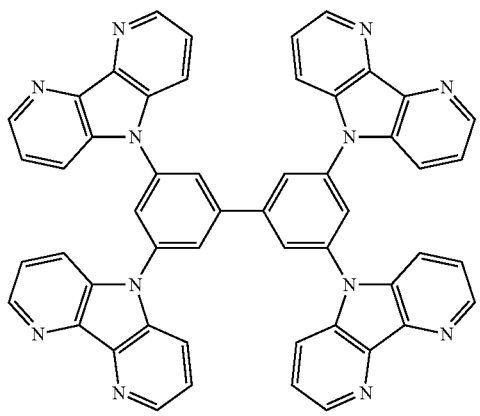
H-7
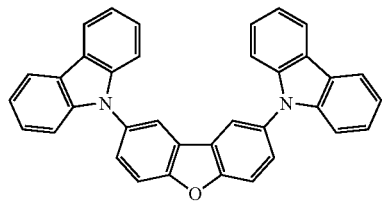
H-8
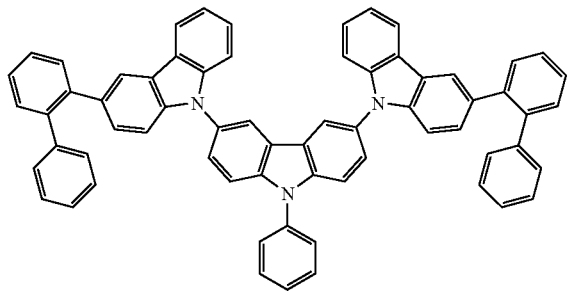
H-9
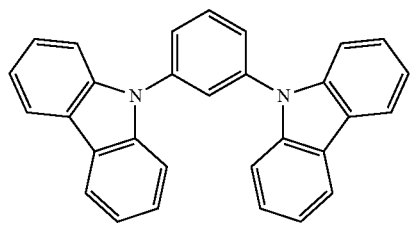
H-10
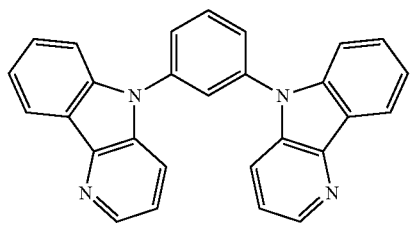
H-11
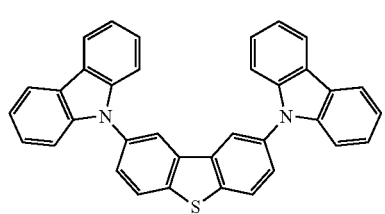
H-12
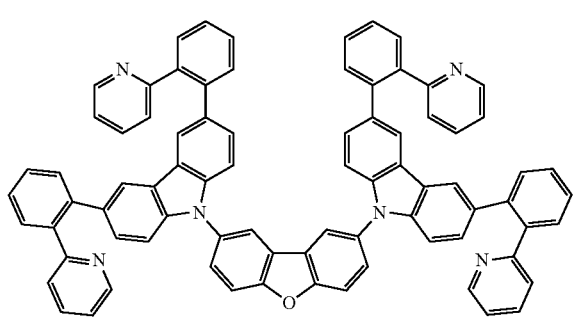

-continued
H-13
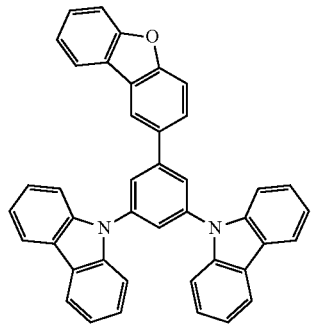
H-14
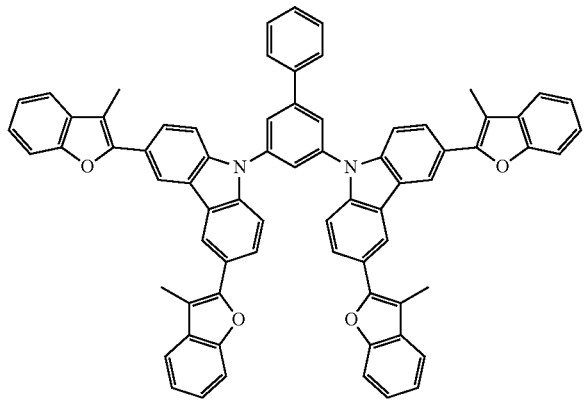
H-15
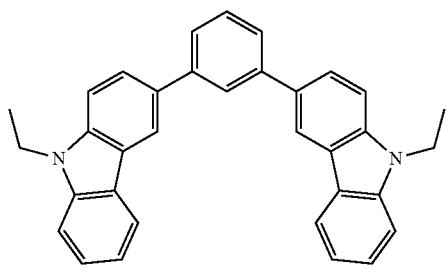
H-16
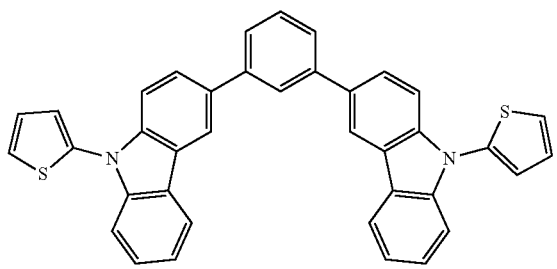
H-17
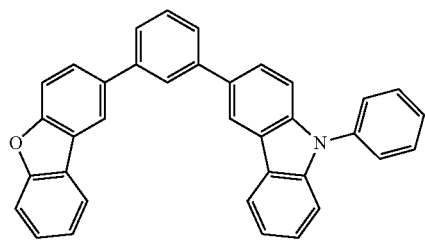
H-18
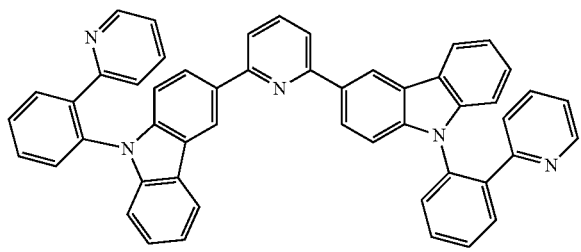
H-19
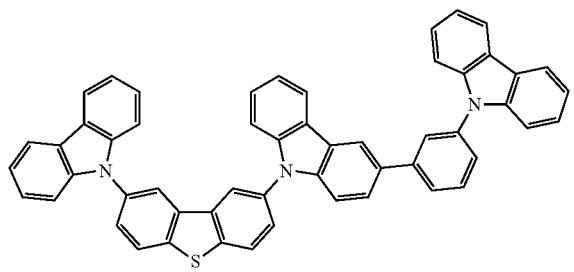
H-20
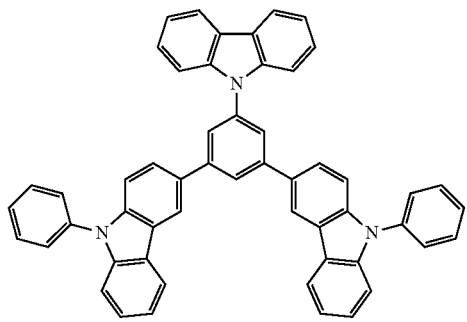

H-21
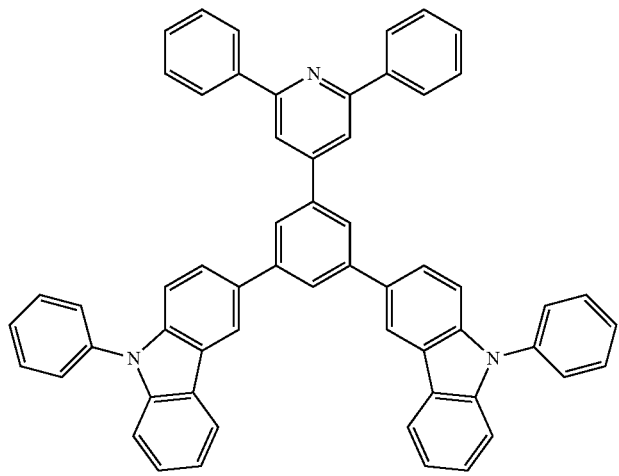
H-22
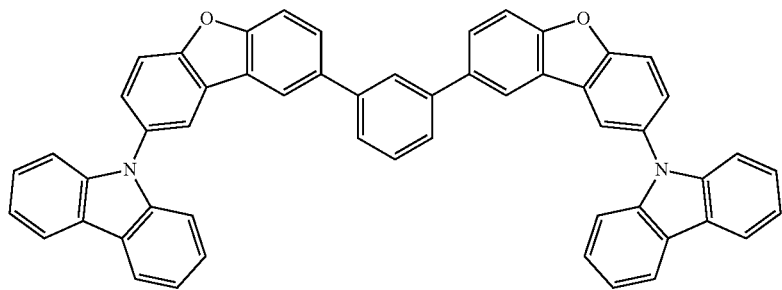
H-23
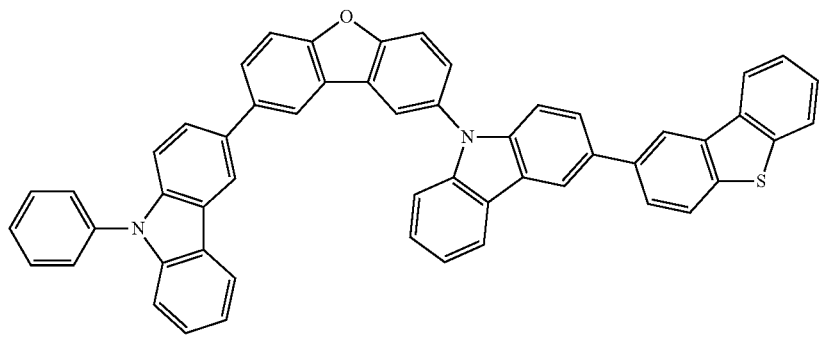
H-24
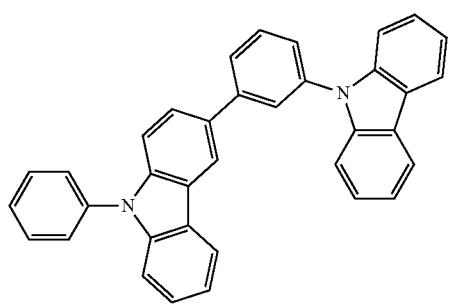
H-25
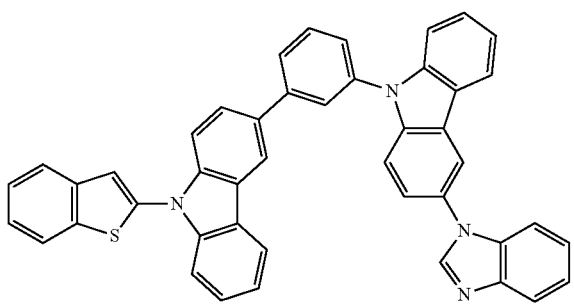

-continued
H-26
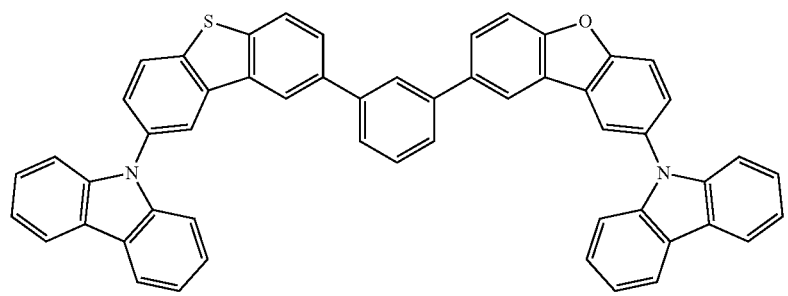
H-27
H-28
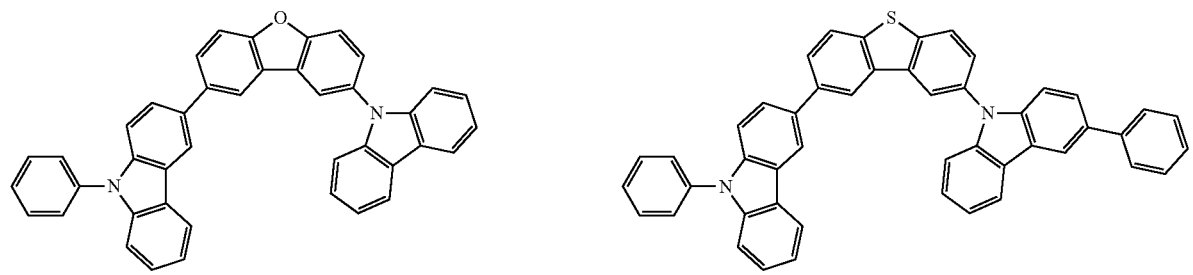
H-29
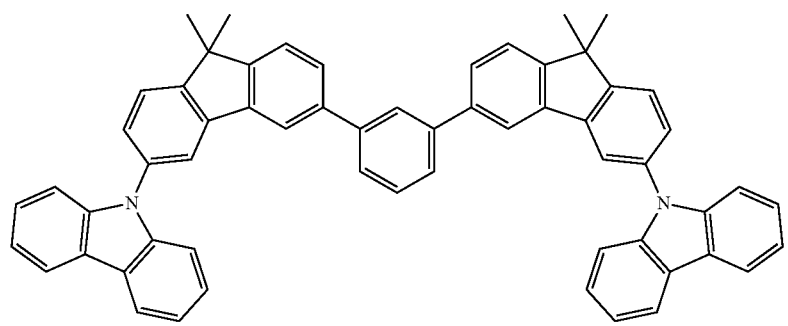
H-30
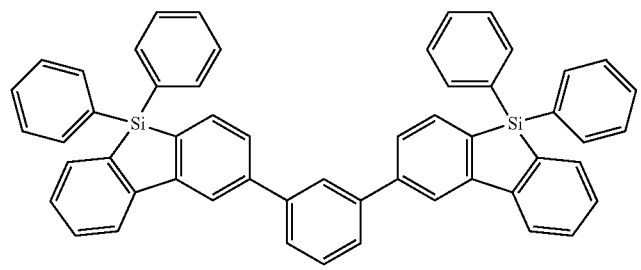

H-31

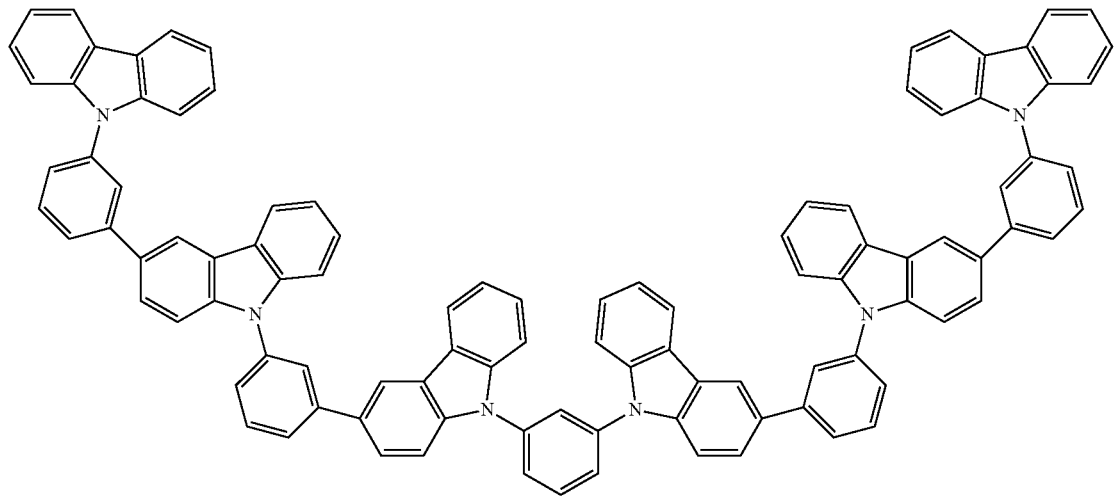

Further, as the host compound, any appropriate host compound may be used individually or in combination. Using a plurality of host compounds at the same time makes it possible to adjust charge transfer and to enhance efficiency of an organic EL element. Still further, using a plurality of emission dopants to be described later makes it possible to mix different emission light components, resulting in any given emission color.

Known light emission hosts used in combination are preferably those having hole transport ability, electron transport ability as well preventing elongation of emission wave length and having high Tg (glass transition temperature).

Practical examples of known light emission hosts include those described in the following documents.

JP-A 2001-257076, JP-A 2002-308855, JP-A 2001-313179, JP-A 2002-319491, JP-A 2001-357977, JP-A 2002-334786, JP-A 2002-8860, JP-A 2002-334787, JP-A 2002-15871, JP-A 2002-334788, JP-A 2002-43056, JP-A 2002-334789, JP-A 2002-75645, JP-A 2002-338579, JP-A 2002-105445, JP-A 2002-343568, JP-A 2002-141173, JP-A 2002-352957, JP-A 2002-203683, JP-A 2002-363227, JP-A 2002-231453, JP-A 2003-3165, JP-A 2002-234888, JP-A 2003-27048, JP-A 2002-255934, JP-A 2002-260861, JP-A 2002-280183, JP-A 2002-299060, JP-A 2002-302516, JP-A 2002-305083, JP-A 2002-305084 and JP-A 2002-308837.

Light Emission Dopant

Light emission dopants are described.

The dopant compound is divided in two types in principle, one is an energy transfer type in which recombination of a carrier occurs on the host compound to which the carrier is transported to excite the host compound, the resulting energy is transferred to the dopant compound, and light is emitted from the dopant compound, and the other is a carrier trap type in which recombination of a carrier occurs on the dopant compound, a carrier trap material, and light is emitted from the dopant compound. However, in each type of the dopant compound, energy level of the dopant compound in excited state is lower than that of the host compound in excited state.

In the energy transfer type, as condition easily transferring energy, the overlapping integral between emission of the host compound and absorption of the dopant compound is greater. In the carrier trap type, it is necessary to have an energy relationship in which a carrier is easily trapped. For example, when an electron carrier is Lapped, it is necessary that electron affinity (LUMO level) of the dopant compound be higher than that (LUMO level) of the host compound.

On the contrary, when a hole carrier is trapped, it is preferable that ionization potential (HOMO level) of the dopant compound be lower than that (HOMO level) of the dopant compound.

In view of the above, the dopant compound can be selected based on emission luminance and emission color including color purity, and the host compound can be selected from compounds which have a good carrier transporting property and satisfy the relationship as described above.

Light emission dopant in light emission layer may be used by selecting any of known light emission dopants of an organic EL element, and fluorescence light emission or phosphorescence light emission organic compound or complexes are preferable.

Representative examples of light emission dopant emitting fluorescence light include compounds giving high fluorescence light quantum yield represented by laser dye, coumarin type dye, man type dye, cyanine type dye, croconium type dye, squarylium type dye, oxobenzanthracene type dye, fluorescein type dye, rhodamine type dye, pyrilium type dye, perylene type dye, stilbene type dye, polythiophene type dye or rare earth complex type fluorescent substances.

The phosphorescence emitting material is a compound which emits light from the excited triplet, which is specifically a compound which emits phosphorescence at room temperature (25° C.), and is defined to exhibit a phosphorescent quantum yield at 25° C. of not less than 0.01, and the phosphorescent quantum yield at 25° C. is preferably not less than 0.1.

The phosphorescent quantum yield can be measured according to a method described in the fourth edition "Jikken Kagaku Koza 7", Bunko II, page 398 (1992) published by Mailmen. The phosphorescent quantum yield in a solution can be measured employing various kinds of solvents. The phosphorescence emitting material of the present invention is a compound, in which the phosphorescent quantum yield measured employing any one of the solvents falls within the above-described range (0.01 or more).

The phosphorescence emitting material according to this invention is preferably a complex containing a metal of Group 8 to 10 of the periodic table, and more preferably an iridium compound, an osmium compound, a europium complex, a platinum compound (a platinum complex compound) or a rare-earth metal complex. Of these, most preferable is an iridium compound.

More preferable phosphorescent dopants according to the invention include compound represented by Formula (1) shown above. Specifically the compounds described in the patent documents listed below are mentioned.

WO 2000/70655, JP-A 2002-280178, JP-A 2001-181616, JP-A 2002-280179, JP-A 2001-181617, JP-A 2002-280180, JP-A 2001-247859, JP-A 2002-299060, JP-A 2001-313178, JP-A 2002-302671, JP-A 2001-345183, JP-A 2002-324679, WO 2002/15645, JP-A 2002-332291, JP-A 2002-50484, JP-A 2002-332292, JP-A 2002-83684, JP-A 2002-540572, JP-A 2002-117978, JP-A 2002-338588, JP-A 2002-170684, JP-A 2002-352960, WO 01/93642, JP-A 2002-50483, JP-A 2002-100476, JP-A 2002-173674, JP-A 2002-359082, JP-A 2002-175884, JP-A 2002-363552, JP-A 2002-184582, JP-A 2003-7469, JP-A 2002-525808, JP-A 2003-7471, JP-A 2002-525833, JP-A 2003-31366, JP-A 2002-226495, JP-A 2002-234894, JP-A 2002-235076, JP-A 2002-241751, JP-A 2001-319779, JP-A 2001-319780, JP-A 2002-62824, JP-A 2002-100474, JP-A 2002-203679, JP-A 2002-343572 and JP-A 2002-203678.

Examples of the light emission dopants are listed, but not limited thereto.

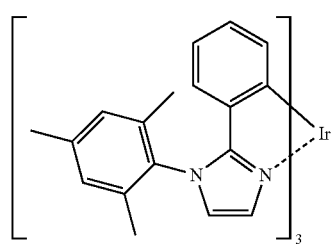

D-1

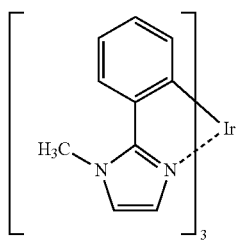

D-2

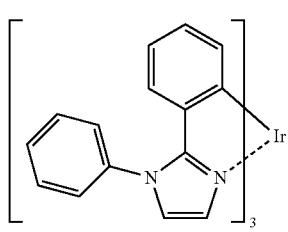

D-3

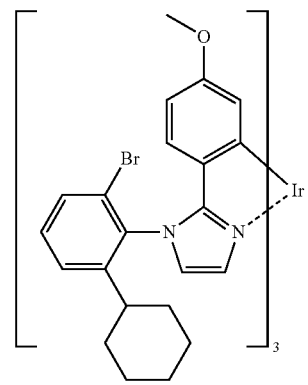

D-4

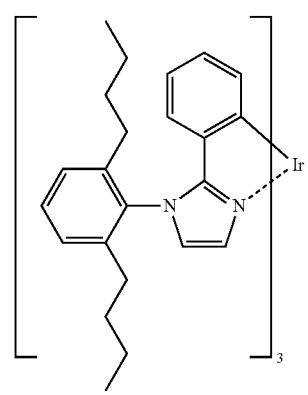

D-5

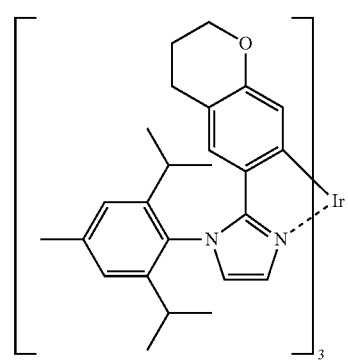

D-6

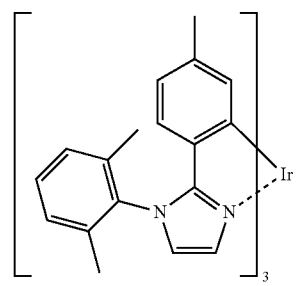

D-7

-continued
D-8
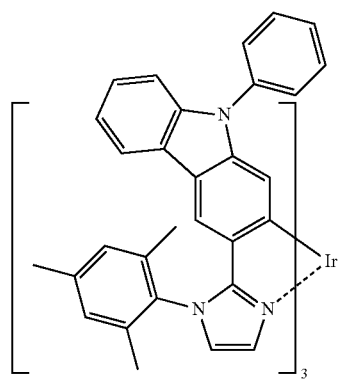
D-9
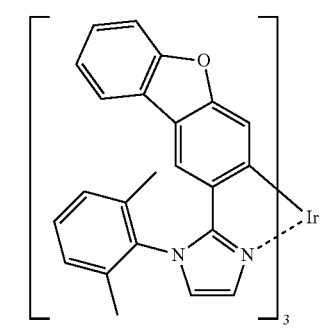
D-10
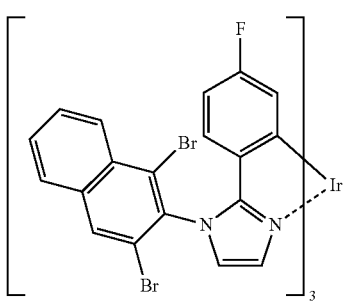
D-11
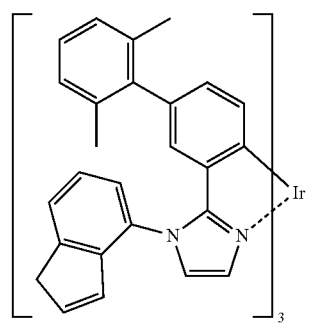
D-12
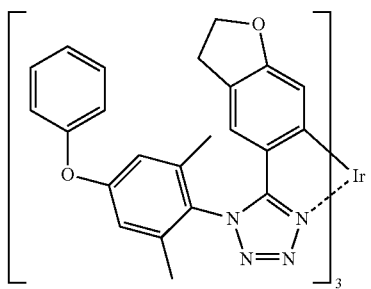
-continued
D-13
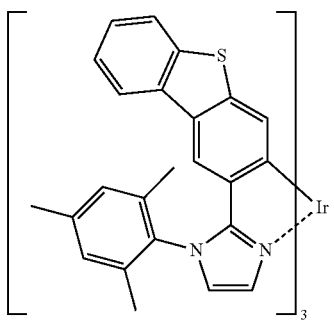
D-14
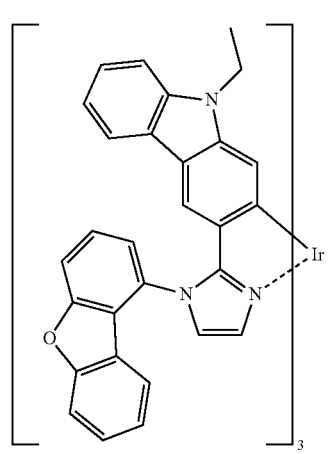
D-15
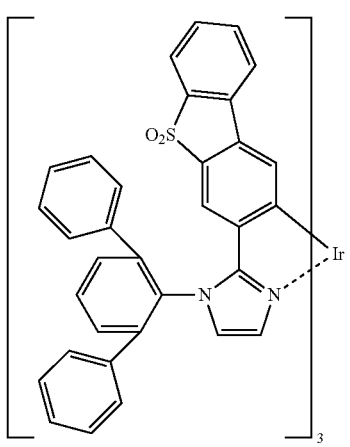
D-16
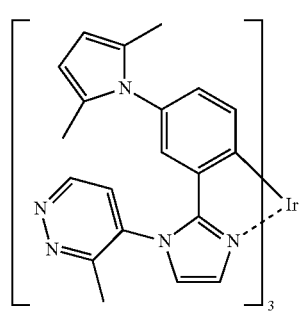

D-17
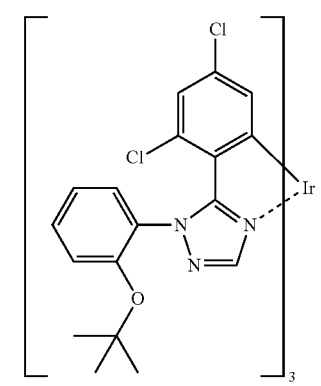
D-18
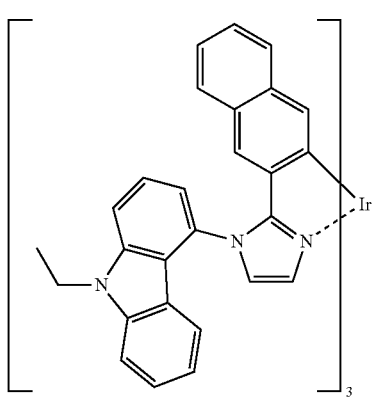
D-19
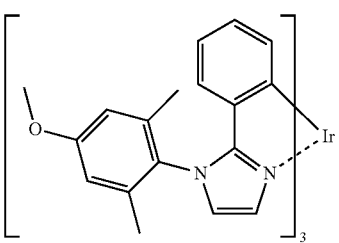
D-20
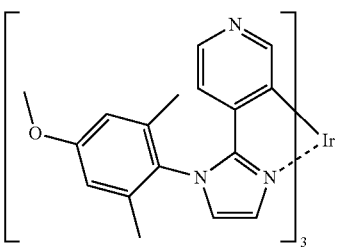
D-21
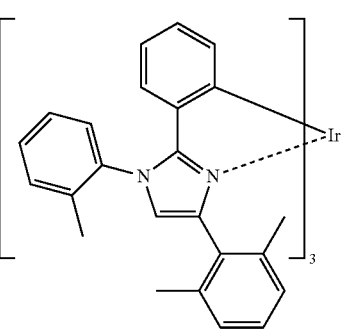
D-22
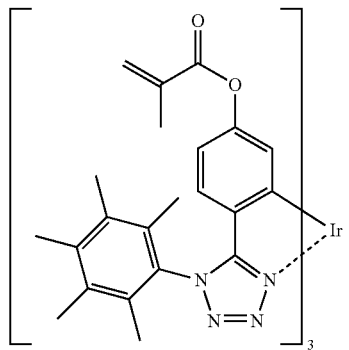
D-23
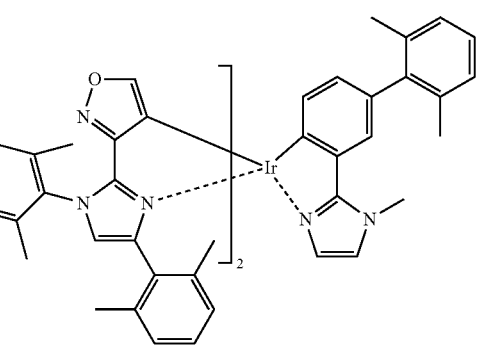
D-24
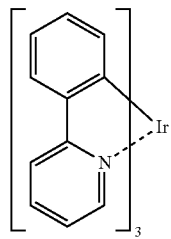
D-25
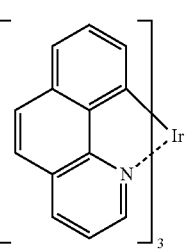
D-26
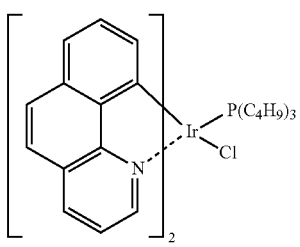

D-27
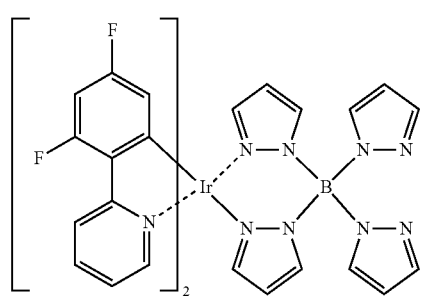
D-28
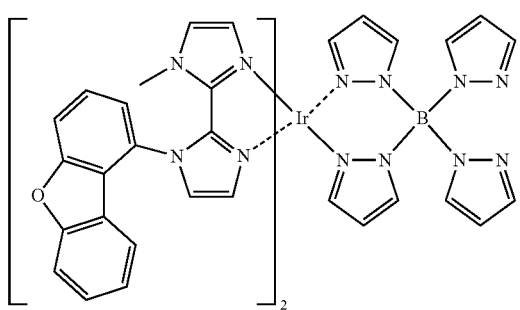
D-29
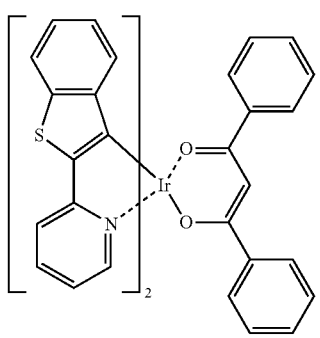
D-30
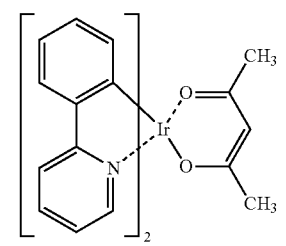
D-31
D-32
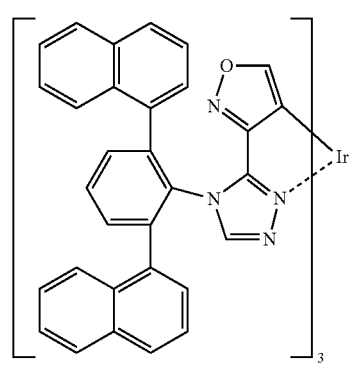
D-33
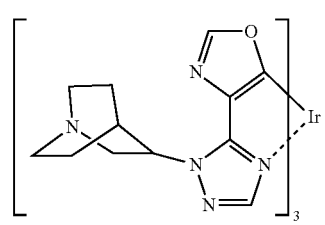
D-34
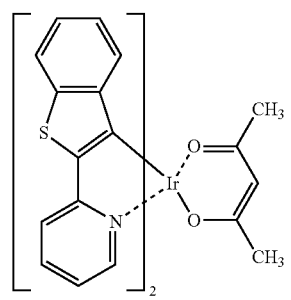
D-35
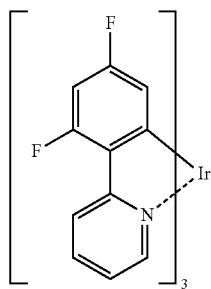
D-36
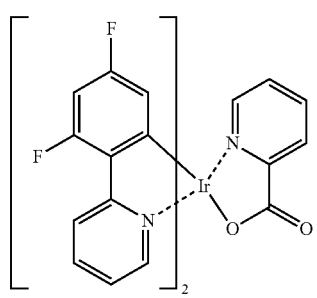

D-37 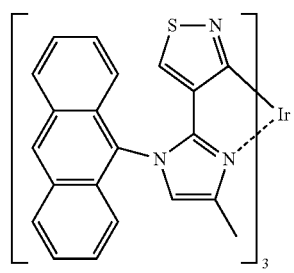
D-42 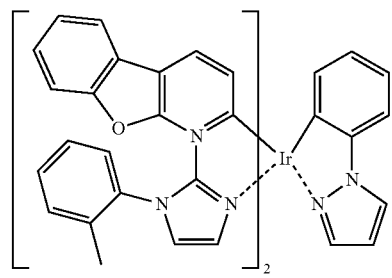
D-38 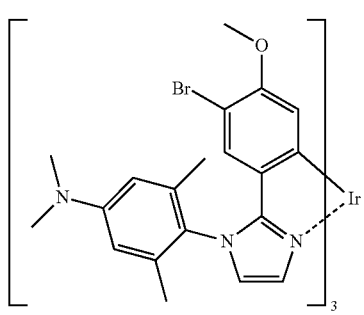
D-43 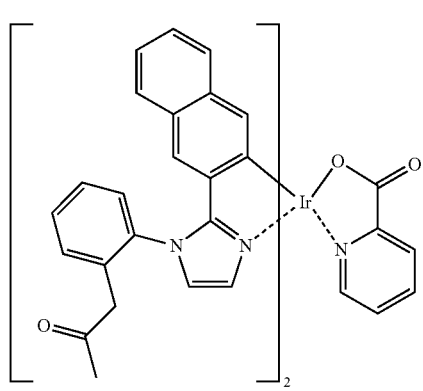
D-39 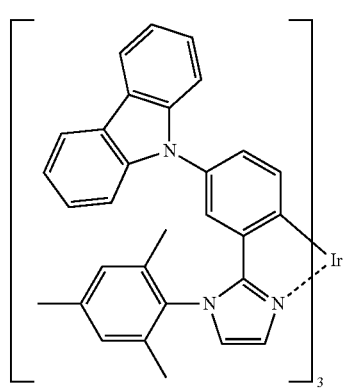
D-44 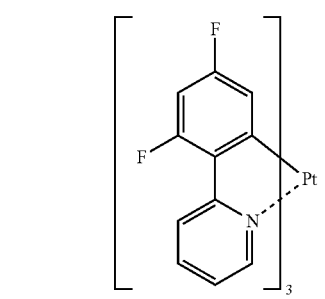
D-40 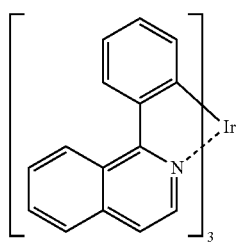
D-45 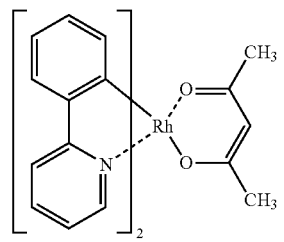
D-41 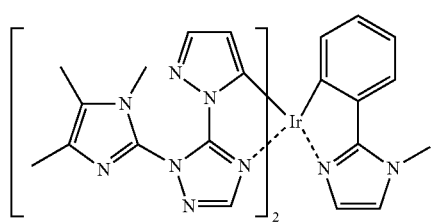
D-46 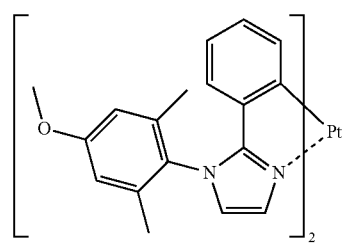

-continued

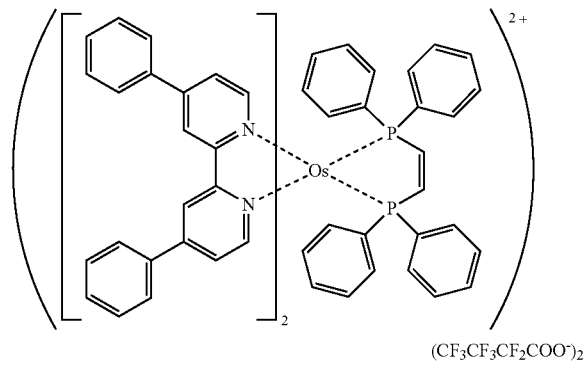
D-47

(CF₃CF₃CF₂COO⁻)₂

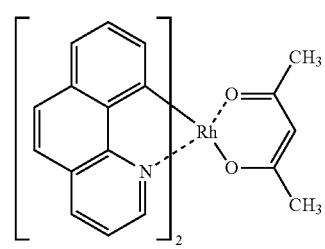
D-48

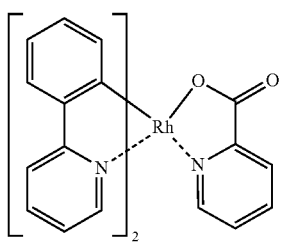
D-49

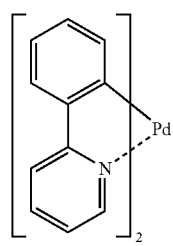
D-50

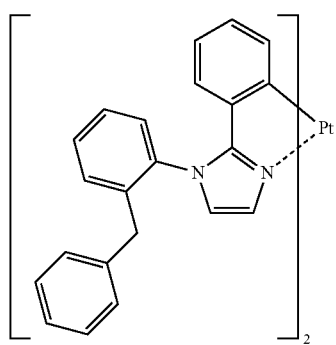
D-51

-continued

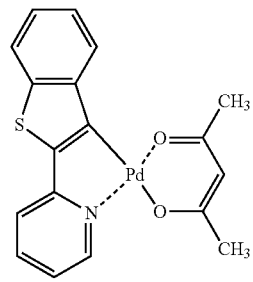
D-52

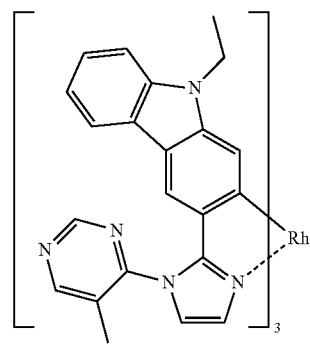
D-53

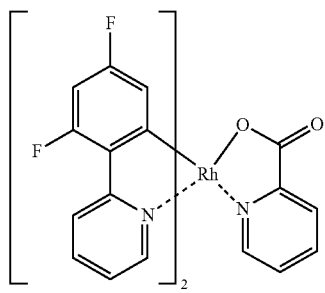
D-54

Particularly, in case that phosphorescent dopants are used in the organic EL element of this invention, triplet energy of the light emission host is preferably larger than the triplet energy of the light emission dopant. According to this, brightness and external taking out efficiency can be enhanced and high quality can be obtained.

Next, component layers of the organic EL element of this invention such as an injection layer, a blocking layer and an electron transport layer are described.

Injection Layer Electron Injection Layer, Hole Injection Layer

An injection layer is provided when it is necessary and includes an electron injection layer and a hole injection layer, which may be arranged between an anode and an emission layer or a positive transfer layer, and between a cathode and an emission layer or an electron transfer layer, as described above.

An injection layer is a layer which is arranged between an electrode and an organic layer to decrease an driving voltage and to improve an emission luminance, which is detailed in volume 2, chapter 2 (pp. 123-166) of "Organic EL Elements and Industrialization Front thereof (Nov. 30, 1998, published by N. T. S. Inc.)", and includes a hole injection layer (an anode buffer layer) and an electron injection layer (a cathode buffer layer). The organic layer is a layer containing an organic substance other than the charge transportable organic compound according to this invention.

An anode buffer layer (a hole injection layer) is also detailed in such as JP-A H09-45479, JP-A H09-260062 and JP-A H08-288069, and specific examples include such as a phthalocyanine buffer layer represented by such as copper phthalocyanine, an oxide buffer layer represented by such as vanadium oxide, an amorphous carbon buffer layer, and a polymer buffer layer employing conductive polymer such as polyaniline (emeraldine) and polythiophene.

The hole injection layer includes a ferrocene compound, described in JP-A H06-025658, a starburst type compound described in JP-A H10-233287, etc., a triarylamine type compound described in JP-A 2000-068058, JP-A 2004-6321, etc., a sulfur containing compound described in JP-A 2002-117979, and a hexaazatriphenylene compound described in US A2002/158242, US A2006/251922, JP-A 2006-49393, etc.

A cathode buffer layer (an electron injection layer) is also detailed in such as JP-A H06-325871, JP-A H09-17574 and JP-A H10-74586, and specific examples include a metal buffer layer represented by strontium, aluminum and so on, an alkali metal compound buffer layer represented by lithium fluoride, an alkali metal earth compound buffer layer represented by magnesium fluoride and an oxide buffer layer represented by aluminum oxide.

The above-described buffer layer (injection layer) is preferably a very thin layer, and the layer thickness is preferably in a range of 0.1 nm to 5 μm although it depends on a raw material.

Block Layer: Hole Block Layer, Electron Block Layer

A block layer is provided in addition to an elemental layer arrangement of the organic compound layer as described above.

There is, for example, a positive block (hole block) layer described in such as JP-A H11-204258 and JP-A H11-204359 and p. 273 of "Organic EL Elements and Industrialization Front Thereof (Nov. 30 (1998), published by NTS. Inc.)".

A hole block layer, in a broad meaning, is provided with a function of electron transport layer, being comprised of a material having a function of transporting an electron but a very small ability of transporting a hole, and can improve the recombination probability of an electron and a hole by inhibiting a hole while transporting an electron. Further, an arrangement of an electron transport layer described later can be appropriately utilized as a hole block layer according to this invention.

It is preferable that the hole transport layer is formed via wet process when the hole transport layer of the organic EL element of this invention is provided adjacent to the light emission layer. Further it is preferable to form via a coating method such as an inkjet method, a printing method and a slot type coater method, and more preferably a slot type coater method among them.

On the other hand, an electron block layer is, in a broad meaning, provided with a function of a hole transport layer, being comprised of a material having a function of transporting a hole but a very small ability of transporting an electron, and can improve the recombination probability of an electron and a hole by inhibiting an electron while transporting a hole. Further, an arrangement of a hole transport layer described later can be appropriately utilized as an electron block layer.

With reference to a thickness of the hole block layer and electron transport layer according to this invention, a first organic layer can behave as a hole block layer or an electron block layer when a metallic compound is formed by a coating condition inhibiting diffusion to the first organic layer. In this instance the thickness of the first organic layer is preferably 3 to 100 nm, and more preferably 5 to 30 nm.

Hole Transport Layer

A hole transport layer contains a material having a function of transporting a hole, and in a broad meaning, a hole injection layer and an electron inhibition layer are also included in a hole transport layer. A single layer of or plural layers of a hole transport layer may be provided.

A hole transport material is those having any one of a property to inject or transport a hole or a barrier property to an electron, and may be either an organic material or an inorganic material. For example, listed are a triazole derivative, an oxadiazole derivative, an imidazole derivative, a polyarylalkane derivative, a pyrazoline derivative, a pyrazolone derivative, a phenylenediamine derivative, a arylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive high molecular oligomer, specifically preferably such as thiophene oligomer.

As a hole transport material, those described above can be utilized, however, it is preferable to utilize a porphyrin compound, an aromatic tertiary amine compound and a styrylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenylether, 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbene; and N-phenylcarbazole, in addition thereto, those having two condensed aromatic rings in a molecule described in U.S. Pat. No. 5,061,569, such as 4,4'-bis[N-(1-naphthyl)-N-phenylamino]biphenyl (NPD), and 4,4',4"-tris[N-(3-methylphenyl)-N-phenylamino]triphenylamine (MTDATA), in which three of triphenylamine units are bonded in a starburst form, described in JP-A H04-308688.

A polymer in which the material mentioned above is introduced in the polymer chain or a polymer having the material as the polymer main chain can be also used. As the hole injecting material or the hole transporting material, inorganic compound such as p-type Si and p-type SiC are usable.

A so-called p-type hole transport layer as disclosed in JP-A No. H11-251067 or described in the literature of J. Huang et al. (Applied Physics Letters 80 (2002), p. 139) is also applicable. In the present invention, these materials are preferably utilized since an emitting element exhibiting a higher efficiency is obtained.

The hole transport layer can be provided by forming a thin layer via coating a hole transport material described above by a known method such as a vacuum evaporation method, a spin coat method, a cast method, a printing method including an inkjet method, a spray method and a slot type coater method. It is preferable to form via wet process when it is provided adjacent to the light emission layer. Further it is preferable to form via a coating method such as an inkjet method, a printing method and a slot type coater method, and more preferably a slot type coater method among them.

The layer thickness of a hole transport layer is not specifically limited, however, is generally 5 nm to 5 μm, and preferably 5 to 200 nm. The hole transport layer may have a single layer structure comprised of one or two or more types of the above described materials.

A hole transport layer having high p-type property doped with impurity can be utilized. Example thereof includes those described in JP-A-H04-297076, JP-A-2000-196140, JP-A-2001-102175, and J. Appl. Phys., 95, 5773 (2004) and so on.

It is preferable to employ such a hole transport layer having high p-type property, since an element with lower power consumption can be prepared in this invention.

The organic charge transport layer of this invention can also be preferably used as a hole transport layer of this invention.

Electron Transport Layer

An electron transport layer is composed of a material having a function of transporting an electron, and in a broad meaning, an electron transport layer and a hole inhibition layer are also included in a hole transport layer. A single layer of or plural layers of an electron transport layer may be provided.

The electron transfer material (it works as a hole inhibition layer, simultaneously), which is employed in a single electron transfer layer and an electron transfer layer provided adjacent to cathode side with respect to emission layer when it is used as plural layers, is sufficient to have a function to transmit an electron injected from a cathode to an emission layer, and compounds conventionally known in the art can be utilized by arbitrarily selection as a material thereof. Any one can be employed by selecting from conventionally known compounds as its material. Examples of a material include such as a nitro-substituted fluorene derivative, a diphenylquinone derivative, a thiopyrandioxide derivative, a heterocyclic tetracarbonic acid anhydride such as naphthaleneperylene, carbodiimide, a fluorenylidenemethane derivative, anthraquinonedimethane and anthrone derivatives, and an oxadiazole derivative, a carboline derivative, or derivative having a carboline ring structure at least one of carbon atom of hydrocarbon ring of which is substituted by nitrogen atom. Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material. Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material.

Further, metal-free or metal phthalocyanine, or those the terminal of which is substituted by an alkyl group and a sulfonic acid group, can be preferably utilized as an electron transfer material. Further, distyrylpyrazine derivative, which has been exemplified as a material of an emission layer, can be also utilized as an electron transfer material, and, similarly to the case of a hole injection layer and a hole transfer layer, an inorganic semiconductor such as an n-type-Si and an n-type-SiC can be also utilized as an electron transfer material.

The electron transport layer can be provided by forming a thin layer via coating an electron transport material described above by a known method such as a vacuum evaporation method, a spin coat method, a cast method, a printing method including an inkjet method, a spray method and a slot type coater method. It is preferable to form via wet process when it is provided adjacent to the light emission layer. Further it is preferable to form via a coating method such as an inkjet method, a printing method and a slot type coater method, and more preferably a slot type coater method among them.

The layer thickness of an electron transport layer is not specifically limited, however, is generally 5 nm to 5 μm, and preferably 5 to 200 nm. The electron transport layer may have a single layer structure comprised of one or two or more types of the above described materials, and it preferable it is composed of two layers according to this invention.

The organic charge transport layer of this invention can also be preferably used as an electron transport layer of this invention.

The charge transportable organic compound used in the organic charge transport layer of this invention may include any charge transportable organic compound as far as they have a charge transportable property, and the compounds represented by Formula (1) described above are preferable. It is supposed that this is because diffusion is inhibited by interaction between oxygen part of the dibenzofuran skeleton and metal ion dissociated in a solvent.

Compounds represented by Formula (1) described above (charge transportable organic compound) of this invention are described.

In Formula (1) described above, Ar and Ar' represent independently an aromatic ring, and n represents an integer of 0 to 8.

In Formula (1), an aromatic ring represented by Ar and Ar' includes an aromatic hydrocarbon ring or an aromatic hetero ring. The aromatic ring may be a single ring or condensed ring, and further may be non-substituted or substituted.

An aromatic hydrocarbon ring represented by Ar and Ar' in Formula (1) includes a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, p-terphenyl ring, an acenaphthene ring, a coronene ring, a fluorene ring, a fluoanthrene ring, a naphthacene ring, a pentacene ring, a perylene ring, a pentaphene ring, a picene ring, a pyrene ring, a pyranthrene ring, an anthraanthrene ring and the like.

An aromatic heterocycle represented by Ar and Ar' in Formula (1) include for example, a furan ring, dibenzofuran ring, thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, an indazole ring, a benzimidazole ring, a benzothiazole ring, a benzoxazole ring, a quinoxaline ring, a quinazoline ring, cinnoline ring, a quinoline ring, an isoquinoline ring, phthalazine ring, naphthylidine ring, a carbazole ring, a carboline ring, a diazacarbazole ring (indicating a group in which one of the carbon atoms constituting the carboline ring of the above carboline group is replaced with a nitrogen atom).

Examples of preferably useable aromatic rings represented by Ar and Ar' in Formula (1) among those described above are a carbazole ring, a carboline ring, dibenzofuran ring, a benzene ring and a pyridine ring, more preferably a carbazole ring, a carboline ring, a benzene ring and a pyridine ring, and further preferably is a benzene ring having a substituent, in particular a benzene ring having carbazolyl group.

A preferable embodiment of the aromatic ring represented by Ar in Formula (1) is an aromatic hydrocarbon condensed ring in which three or more rings are condensed, examples of three or more rings condensed include practically a naphthacene ring, an anthracene ring, a tetracene ring, a pentacene ring, a hexacene ring, a phenanthrene ring, a pyrene ring, a benzopyrene ring, a benzoazulene ring, a chrysene ring, a benzochrysene ring, an acenaphthene ring, an acenaphthylene ring, a triphenylene ring, a coronene ring, a benzoquinone ring, a hexabenzocoronene ring, a fluorene ring, a benzofluorene ring, a fluoranthene ring, a perylene ring, a perylene ring, a naphthoperylene ring, a pentabenzoperylene ring, a benzoperylene ring, a pentaphene ring, a picene ring, a pyranthrene ring, a coronene ring, a naphthocoronene ring, an ovalene ring, and an anthraanthrene ring.

These rings may further have a substituent.

Examples of a condensed aromatic heterocycle having three or more rings are practically acridine ring, a benzoquinoline ring, a carbazole ring, a carboline ring, a phenazine ring, a phenanthridine ring, a phenanthroline ring, a carboline ring, a cycladine ring, a quindoline ring, a thebenidine ring, a quinindoline ring, a triphenodithiazine ring, a triphenodioxazine ring, a phenanthrazine ring, an anthrazine ring, a perimizine ring, a diazacarbazole ring (indicating a ring structure in which one of the carbon atoms constituting the carboline ring is replaced with a nitrogen atom), a phenanthroline ring, a dibenzofuran ring, a dibenzothiophene ring, a naphthofuran ring, a naphthothiophene ring, a benzodifuran ring, a benzodithiophene ring, an anthrafuran ring, an anthradifuran ring, an anthrathiophene ring, an anthradithiophene ring, a thianthrene ring, a phenoxathiine ring, and a thiophanthrene ring (naphthothiophene ring). These rings may further have a substituent.

In Formula (1), n represents an integer of 0 to 8, preferably 0 to 2, and in particular 1 to 2 is preferable.

A pair of electrodes means an anode and a cathode in this invention.

Anode

As an anode according to an organic EL element, those comprising metal, alloy, a conductive compound as the electrode material, which has a large work function (not less than 4 eV), and a mixture thereof as an electrode substance are preferably utilized. Specific examples of such an electrode substance include a conductive transparent material such as metal such as Au, CuI, indium tin oxide (ITO), $SnO_2$ and ZnO. Further, a material such as IMO ($In_2O_3$—ZnO), which can prepare an amorphous and transparent electrode, may be also utilized.

As for an anode, these electrode substances may be made into a thin layer by a method such as evaporation or spattering and a pattern of a desired form may be formed by means of photolithography, or in the case of requirement of pattern precision is not so severe (not less than 100 μm), a pattern may be formed through a mask of a desired form at the time of evaporation or spattering of the above-described substance. Otherwise wet process such as printing method and coating method may be used when a substance such as an organic conductive material which may be coated.

When emission is taken out of this anode, the transmittance is preferably set to not less than 10% and the sheet resistance as an anode is preferably not more than a few hundreds Ω/□. Further, although the layer thickness depends on a material, it is generally selected in a range of 10 to 1,000 nm and preferably of 10 to 200 nm.

Cathode

On the other hand, as a cathode according to this invention, metal (called as electron injecting metal), alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal.

Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum.

As for a cathode, these electrode substances may be made into a thin layer by a method such as evaporation or spattering. Further, the sheet resistance as a cathode is preferably not more than a few hundreds Ω/□ and the layer thickness is generally selected in a range of 10 nm to 5 μm and preferably of 50 to 200 nm. Herein, to transmit emission, either one of an anode or a cathode of an organic EL element is preferably transparent or translucent to improve the mission luminance.

Further, a transparent or translucent cathode can be manufactured by providing a conductive transparent material as shown in the description of anode on the cathode in a thickness of 1 to 20 nm. An element having anode and cathode both transparent can be manufactured by applying this.

Substrate

A substrate (referred as a base body, a base plate, a base material or supporting body or so) according to an organic EL element of this invention is not specifically limited with respect to types of such as glass and plastics, and may be transparent or opaque. The substrate utilized is preferably transparent when the light is taken out from the substrate side. The transparent substrate preferably used includes such as glass, quartz and transparent resin film. A specifically preferable substrate is resin film capable of providing an organic EL element with a flexible property.

Resin film includes such as: polyesters such as polyethylene terephthalate (PET) and polyethylene naphthalate (PEN); polyethylene, polypropylene; cellulose esters or their derivatives such as cellophane, cellulose diacetate, cellulose triacetate, cellulose acetate butylate, cellulose acetate propionate (CAP), cellulose acetate phthalate (TAC) and cellulose nitrate; polyvinylidene chloride, polyvinyl alcohol, polyethylene vinyl alcohol, syndiotactic polystyrene, polycarbonate, norbornane resin, polymethylpentene, polyether ketone, polyimide, polyether sulfone (PES), polyphenylene sulfide, polysulfones, polyetherimide, polyether ketone imide, polyamide, fluororesin, Nylon, polymethylmethacrylate, acrylic resin, polyacrylate; and cycloolefin resins such as ARTON (produced by JSR Co. Ltd.) and APEL (produced by Mitsui Chemicals, Inc.).

On the surface of a resin film, formed may be a film incorporating inorganic and organic compound or a hybrid film of both. Barrier films are preferred at a water vapor permeability of at most 0.01 g/($m^2$/day·atm). Further, high barrier films are preferred at an oxygen permeability of at most $1 \times 10^{-3}$ g/$m^2$·/day, and at a water vapor permeability of at most $10^{-5}$ g/$m^2$/day.

As materials forming a barrier film, employed may be those which retard penetration of moisture and oxygen, which deteriorate the element. For example, it is possible to employ silicon oxide, silicon dioxide, and silicon nitride. Further, in order to improve the brittleness of the aforesaid film, it is more preferable to achieve a laminated layer structure of inorganic layers and organic layers. The laminating order of the inorganic layer and the organic layer is not particularly limited, but it is preferable that both are alternatively laminated a plurality of times.

As for the forming method of a barrier film, there is no restriction in particular and for example, a vacuum vapor deposition method, a sputtering method, a reactive-sputtering method, a molecular beam epitaxy method, the ionized cluster beam method, the ion plating method, the plasma polymerizing method, the atmospheric pressure plasma polymerizing method, plasma CVD method, a laser CVD method, a heat CVD method, and a coating method, can be used. The atmospheric pressure plasma polymerizing method listed in JP A-2004-68143 is particularly preferable.

Examples of opaque substrate include, metal plate such as aluminum and stainless steal, a substrate of film and opaque resin, and a substrate made of ceramic.

An external taking out efficiency of luminescence at room temperature of the organic EL element of the present invention, is preferable to be 1% or more, and more preferably 5% or more. Here, the external quantum efficiency (%)=number of photon emitted to the outside of the organic EL element/ number of electron supplied to the organic EL element×100.

Also, there can be used a hue improving filter such as color filter or color conversion filter which changes a luminescent color from an organic EL device into a multiple color using a phosphor can be used together. In case color conversion filter, λ max of luminescence of the organic EL element is preferably 480 nm or less.

Sealing

As sealing means employed in the present invention, listed may be, for example, a method in which sealing members, electrodes, and a supporting substrate are subjected to adhesion via adhesives.

The sealing members may be accepted as far as it is provided so as to cover display area of an organic EL element, and may be concave plate or flat plate. Transparency or electric insulation is not required.

Specifically listed are glass plates, polymer plate-films, metal plates, and films. Specifically, it is possible to list, as glass plates, sodium-lime glass, barium-strontium containing glass, lead glass, aluminosilicate glass, borosilicate glass, barium borosilicate glass, and quartz. Further, listed as polymer plates may be polycarbonate, acryl, polyethylene terephthalate, polyether sulfide, and polysulfone. As a metal plate, listed are those composed of at least one metal selected from the group consisting of stainless steel, iron, copper, aluminum, magnesium, nickel, zinc, chromium, titanium, molybdenum, silicon, germanium, and tantalum, or alloys thereof.

Polymer films and metal films are preferably used in this invention since elements can be made thinner.

Further, the polymer film preferably has an oxygen permeability of $1 \times 10^{-3}$ ml/m$^2$/24 h or less, measured in accordance with JIS K 7126-1987, and a water vapor permeability of, $1 \times 10^{-3}$ g/(m$^2$/24 h) or less at 25±0.5° C. and 90±2% RH, measured in accordance with JIS K 7129-1992.

Conversion of the sealing member into concave is carried out employing a sand blast process or a chemical etching process.

In practice, as adhesives, listed may be photo-curing and heat-curing types having a reactive vinyl group of acrylic acid based oligomers and methacrylic acid, as well as moisture curing Further listed may be thermal and chemical curing types (mixtures of two liquids) such as epoxy based ones. Still further listed may be hot-melt type polyamides, polyesters, and polyolefins. Yet further listed may be cationically curable type ultraviolet radiation curable type epoxy resin adhesives.

In addition, since an organic EL element is occasionally deteriorated via a thermal process, those are preferred which enable adhesion and curing between room temperature and 80° C. Further, desiccating agents may be dispersed into the aforesaid adhesives. Adhesives may be applied onto sealing portions via a commercial dispenser or printed on the same in the same manner as screen printing.

Further, it is appropriate that on the outside of the aforesaid electrode which interposes the organic layer and faces the support substrate, the aforesaid electrode and organic layer are covered, and in the form of contact with the support substrate, inorganic and organic material layers are formed as a sealing film. In this case, as materials forming the aforesaid film may be those which exhibit functions to retard penetration of those such as moisture or oxygen which results in deterioration. For example, it is possible to employ silicon oxide, silicon dioxide, and silicon nitride.

Still further, in order to improve brittleness of the aforesaid film, it is preferable that a laminated layer structure is formed, which is composed of these inorganic layers and layers composed of organic materials. Methods to form these films are not particularly limited. It is possible to employ, for example, a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a thermal CVD method, and a coating method.

In a gas phase and a liquid phase, it is preferable to inject inert gases such as nitrogen or argon, and inactive liquids such as fluorinated hydrocarbon or silicone oil into the space between the sealing member and the surface region of the organic EL element. Further, it is possible to form vacuum. Still further, it is possible to enclose hygroscopic compounds in the interior.

Examples of hygroscopic compounds include metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). In sulfates, metal halides, and perchlorates, suitably employed are anhydrides.

Protective Film and Protective Plate

The aforesaid sealing film on the side which nips the organic layer and faces the support substrate or on the outside of the aforesaid sealing film, a protective or a protective plate may be arranged to enhance the mechanical strength of the element. Specifically, when sealing is achieved via the aforesaid sealing film, the resulting mechanical strength is not always high enough, whereby it is preferable to arrange the protective film or the protective plate described above. Usable materials for these include glass plates, polymer plate-films, and metal plate-films which are similar to those employed for the aforesaid sealing. However, in terms of light weight and a decrease in thickness, it is preferable to employ polymer films.

Light Taking Out

It is generally known that an organic EL element emits light in the interior of the layer exhibiting the refractive index (being about 1.7 to about 2.1) which is greater than that of air, whereby only about 15% to about 20% of light generated in the light emitting layer is extracted. This is due to the fact that light incident to an interface (being an interface of a transparent substrate to air) at an angle of θ which is at least critical angle is not extracted to the exterior of the element due to the resulting total reflection, or light is totally reflected between the transparent electrode or the light emitting layer and the transparent substrate, and light is guided via the transparent electrode or the light emitting layer, whereby light escapes in the direction of the element side surface.

Means to enhance the efficiency of the aforesaid light extraction include, for example, a method in which roughness is formed on the surface of a transparent substrate, whereby total reflection is minimized at the interface of the transparent substrate to air (U.S. Pat. No. 4,774,435), a method in which efficiency is enhanced in such a manner that a substrate results in light collection (JP-A 863-314795), a method in which a reflection surface is formed on the side of the element (JP-A 1101-220394), a method in which a flat layer of a middle refractive index is introduced between the substrate and the light emitting body and an antireflection film is formed (JP-A S62-172691), a method in which a flat layer of a refractive index which is equal to or less than the substrate is introduced between the substrate and the light emitting body (JP-A 2001-202827), and a method in which a diffraction grating is formed between the substrate and any of the layers such as the transparent electrode layer or the light emitting layer (including between the substrate and the outside) (JP-A H11-283751).

In the present invention, it is possible to employ these methods while combined with the organic EL element of the present invention. Of these, it is possible to appropriately employ the method in which a flat layer of a refractive index which is equal to or less than the substrate is introduced between the substrate and the light emitting body and the method in which a diffraction grating is formed between the substrate and any of the layers such as the transparent electrode layer or the light emitting layer (including between the substrate and the outside).

By combining these means, the present invention enables the production of elements which exhibit higher brightness or excellent in durability.

When a low refractive index medium of a thickness, which is greater than the wavelength of light, is formed between the transparent electrode and the transparent substrate, the external taking out efficiency of light emitted from the transparent electrode to the exterior increases as the refractive index of the medium decreases.

As materials of the low refractive index layer, listed are, for example, aerosol, porous silica, magnesium fluoride, and fluorine based polymers. Since the refractive index of the transparent substrate is commonly about 1.5 to about 1.7, the refractive index of the low refractive index layer is preferably at most approximately 1.5, but is more preferably at most 1.35.

Further, thickness of the low refractive index medium is preferably at least two times the wavelength in the medium. The reason is that when the thickness of the low refractive index medium reaches nearly the wavelength of light so that electromagnetic waves oozed via evanescent enter into the substrate, effects of the low refractive index layer are lowered.

The method in which the interface which results in total reflection or a diffraction grating is introduced in any of the media is characterized in that light extraction efficiency is significantly enhanced. The above method works as follows. By utilizing properties of the diffraction grating capable of changing the light direction to the specific direction different from diffraction via so-called Bragg diffraction such as primary diffraction or secondary diffraction of the diffraction grating, of light emitted from the light emitting layer, light, which is not emitted to the exterior due to total reflection between layers, is diffracted via introduction of a diffraction grating between any layers or in a medium (in the transparent substrate and the transparent electrode) so that light is extracted to the exterior.

It is preferable that the introduced diffraction grating exhibits a two-dimensional periodic refractive index. Since light emitted in the light emitting layer is randomly generated to all directions, in a common one-dimensional diffraction grating exhibiting a periodic refractive index distribution only in a certain direction, light which travels to the specific direction is only diffracted, whereby light extraction efficiency is not sufficiently enhanced. However, by changing the refractive index distribution to a two-dimensional one, light, which travels to all directions, is diffracted, whereby the light extraction efficiency is enhanced.

As noted above, a position to introduce a diffraction grating may be between any layers or in a medium (in a transparent substrate or a transparent electrode). However, a position near the organic light emitting layer, where light is generated, is preferable.

In this case, the cycle of the diffraction grating is preferably about ½ to about 3 times the wavelength of light in the medium.

The preferable arrangement of the diffraction grating is such that the arrangement is two-dimensionally repeated in the form of a square lattice, a triangular lattice, or a honeycomb lattice.

Light Collection Sheet

Via a process to arrange a structure such as a micro-lens array shape on the light extraction side of the organic EL element of the present invention or via combination with a so-called light collection sheet, light is collected in the specific direction such as the front direction with respect to the light emitting element surface, whereby it is possible to enhance luminance in the specific direction.

In an example of the micro-lens array, square pyramids to realize a side length of 30 μm and an apex angle of 90 degrees are two-dimensionally arranged on the light extraction side of the substrate. The side length is preferably 10 μm to 100 μm. When it is less than the lower limit, coloration occurs due to generation of diffraction effects, while when it exceeds the upper limit, the thickness increases undesirably.

It is possible to employ, as a light collection sheet, for example, one which is put into practical use in the LED backlight of liquid crystal display devices. It is possible to employ, as such a sheet, for example, the luminance enhancing film (BEF), produced by Sumitomo 3M Limited. As shapes of a prism sheet employed may be, for example, triangle shaped stripes of an apex angle of 90 degrees and a pitch of 50 μm formed on a base material, a shape in which the apex angle is rounded, a shape in which the pitch is randomly changed, and other shapes.

Further, in order to control the light radiation angle from the light emitting element, simultaneously employed may be a light diffusion plate-film. For example, it is possible to employ the diffusion film (LIGHT-UP), produced by Kimoto Co., Ltd.

Manufacturing Method of Organic EL Element

A manufacturing method of the organic EL element, which is an example of this invention, is described using an organic EL element composed of anode/hole injection layer/hole transport layer/light emission layer/electron transport layer/electron injection layer/cathode. The invention is not imitated to this example.

An anode is prepared by forming a thin layer composed of a desirable electrode substance, for example, substance for an anode and having a layer thickness of 1 µm or less, preferably 10 to 200 nm, via vapor deposition or spattering method on a substrate.

After the preparation, cleaning and surface modification treatment process or charge removing treatment process may be subjected to.

A low-pressure mercury lamp, an excimer lamp, a plasma cleaning apparatus and the like can be utilized for the cleaning and surface modification treatment. Surface modification is conducted to remove organic contamination and improve wettability by the cleaning and surface modification treatment.

Charge removing treatment process includes roughly photo irradiation method and corona discharge method, and the photo irradiation method generates weak X ray and corona discharge method generates aero ion by corona discharge. The aero ion is withdrawn to a charged material to supply an opposite polarity charge, and neutralize static electricity. Static eliminator by corona discharge and static eliminator by soft X-rays can be utilized. Charge on the substrate is removed by this charge removing treatment process, and yield of the elements are improved because adhesion of dust and electrical breakdown are prevented.

Next, thin layers of the organic compound of the organic EL element materials such as a hole injection layer, a hole transport layer, light emission layer, an electron transport layer, an electron injection layer, hole block layer on this.

Though the organic layers of the organic EL element of this invention is formed via a vacuum evaporation method, or wet process such as a spin coat method, a cast method, an inkjet method, a spray method, a printing method and a slot type coater method as described above, it is preferable to form the one or all organic layers according to the invention via wet process such as a spin coat method, an inkjet method, a spray method, a printing method, a slot type coater method, and in particular a slot type coater method or an inkjet coating method are preferable among them in view of that a uniform layer can be easily obtained and generation of pin hole is inhibited.

Examples of medium liquid to dissolve or disperse the organic compound material according to this invention include organic solvent of ketones such as methylethyl ketone and cyclohexanone, aliphatic acid esters such as ethyl acetate and butyl acetate, halogenated hydrocarbons such as dichlorobenzene, aromatic hydrocarbons such as toluene, xylene, mesitylene and cyclohexyl benzene, aliphatic hydrocarbons such as cyclohexane, decalin and dodecane, DMF and DMSO, in particular alcohols described above are preferable to dissolve an organic charge transport layer material and fluorinated alcohols are further preferable. As for the dispersion method, those using ultrasonic wave, high share force and medium dispersion can be used.

Solvent may be removed in the after coating. Drying oven can be used in the drying process, and it is possible to select adequate zone numbers and change the temperature condition or wind velocity according to the material of the organic compound layer in the drying oven.

Heat process may be subjected to after removing solvent. The substrate may be subjected to reduced pressure ($10^6$ to $10^{-2}$ Pa) after heat process, and optionally may be subjected to heating. Drive-in time is preferably 1 to 200 hours. Oxygen or micro amount of water causing deterioration of the elements is removed by this.

After forming these layers, a thin layer composed of a substance for cathode is formed thereon so as to have a thickness of 1 µm or less, preferably in the range of 50 to 200 nm, via, for example, vapor deposition or spattering method to provide a cathode, and desirable organic EL element is obtained.

It is possible to manufacture in reverse layer order such as a cathode, an electron injection layer, an electron transport layer, a light emission layer, a hole transport layer, a hole injection layer and an anode. A layer corresponding to the organic charge transport layer is a hole transport layer in this instance according to this invention. When DC voltage is applied to the multiple color display device thus obtained, light emission can be observed by applying voltage around 2 to 40 V between the anode as +(plus), and the cathode as − (minus) polarities. Also AC voltage may be applied. Wave shape may be arbitrary in this instance.

Wet Process

A coating method by the slot type coater or the inkjet coating method is preferable as a method to form a very thin and high smoothness single layer coated film required for an organic layer of the organic EL element, in this invention. The coating method by the slot type coater or the inkjet coating method is detailed below.

Uniformity of coating is further improved by providing a reduced pressure chamber at upstream of the coater and maintaining the reduced pressure at bead portion when the slot type coater is used. Contacting position of coating-liquid to the liquid is scarcely varied and coat film having uniform layer thickness can be obtained by reducing the pressure of the lower position of the bead even though surface property or wettability of the support varies.

By the method by the slot type coater, coating-liquid supplied by coating-liquid supplying device spreads at pocket portion of the coater die in width direction, is discharged from slit portion in width direction at uniform flow rate, and is coated on the support in width direction with uniform coat layer thickness. It is preferable embodiment to providing the reduced pressure chamber device at upstream position of the coater die.

The inkjet head is not particularly restricted and includes, for example, a thermal type head which has an exothermic element and coating-liquid is discharged from a nozzle by sudden volume change of the coating-liquid by film boiling due to heat energy from the exothermic element, and a shearing mode type (piezo type) head which has a diaphragm provided with a piezoelectric element in an ink pressure chamber, and coating-liquid is discharged by pressure change in an ink pressure chamber via the diaphragm.

Figure 2:
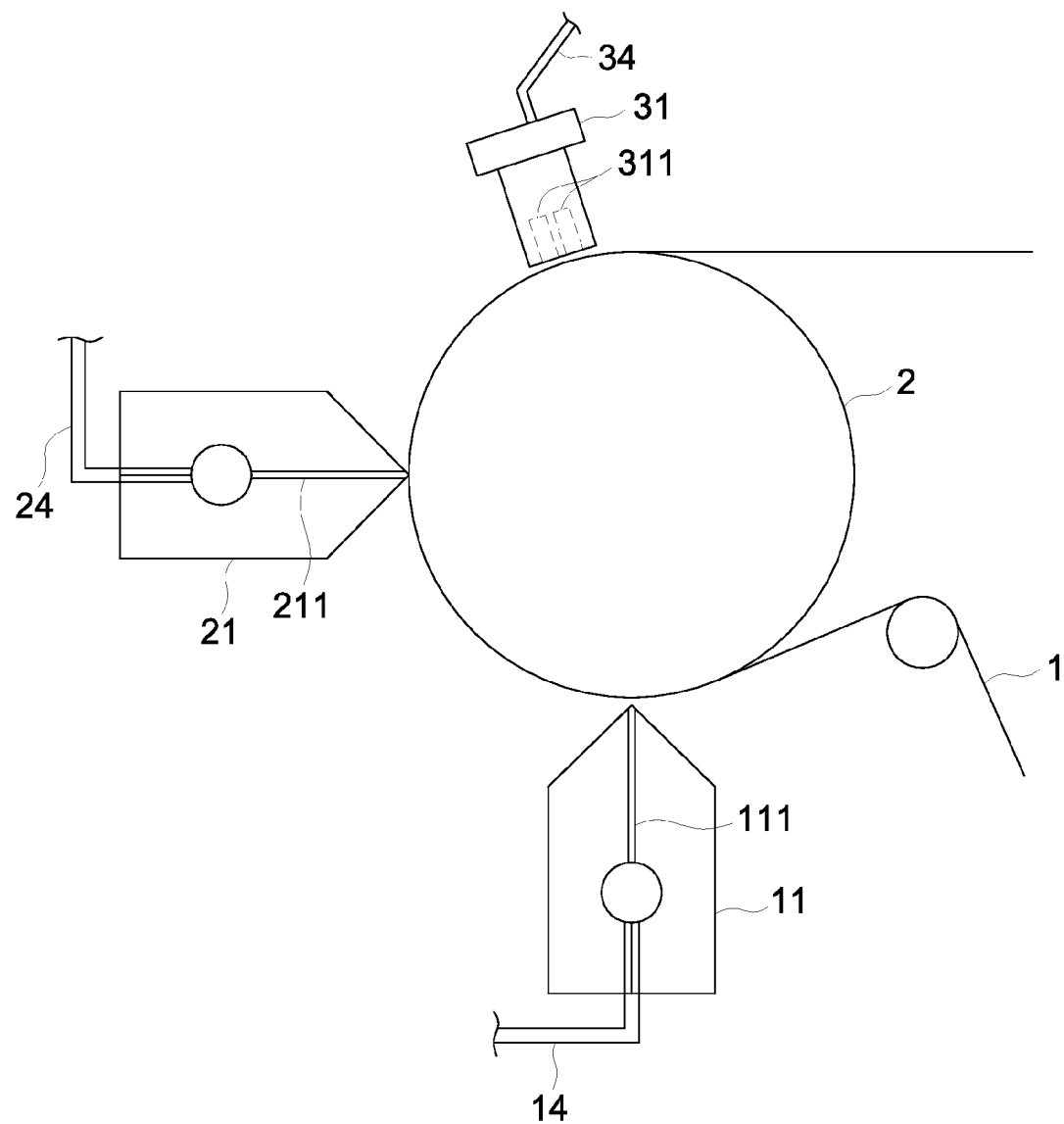
FIG. 2: Enlarged side view of the coating apparatus shown in FIG. 1.

FIG. 1 is a schematic drawing illustrating an example of the coating apparatus using a manufacturing method applied to the organic EL element of this invention. FIG. 1 is an example which forms a 3-layer coat film by coating 3 types coating-liquid as superposed, in which 2 layers are coated by using a slot type coater (hereafter referred as a coater in abbreviation), one layer is coated by an inkjet. FIG. 2 is an enlarged side view of the coating apparatus shown by FIG. 1 observed from the arrow Z1. The waters 11 and 21 are sectional view.

Roll shape wound long size support 1 is wound out from a feed roll (not shown in the drawing) by driving means (not shown in the drawing) in a direction shown by arrow B.

Long size support 1 is conveyed while supported by a back-up roll 2, each layer is coated by coating means composed of coater 11 of coating unit 10, coater 21 of coating unit 20 and inkjet head 311 arranged in inkjet unit 31 of coating unit 30 individually in sequence, and multi-layer coat film composed of 3 layers are formed. The formed multi-layer coat film is dried in drying section (not shown in the drawing), and is wind up by a winding roll (not shown in the drawing).

Coating unit 10 is composed by containing coater 11, supplying pump 12, coating-liquid tank 13 and coating-liquid supply pipe 14. Supplying pump 12 supplies coating-liquid reserved in coating-liquid tank 13 to coater 11 through coating-liquid supply pipe 14. Coater 11 has support slit 111 corresponding to coating width in width direction, and is arranged at a position faced to back-up roll 2 via support 1. Coater 11 discharges coating-liquid through slit 111 to support 1 to conduct coating. Coating unit 10 also has a function to uniformly discharge coating-liquid through slit 111 throughout the width direction of support 1.

Coating unit 20 is composed by containing coater 21, supplying pump 22, coating-liquid tank 23 and coating-liquid supply pipe 24. The function is the same as coating unit 10.

Coating unit 30 is composed by containing inkjet unit 31, inkjet head 311 arranged in inkjet unit 31, coating-liquid tank 33 and coating-liquid supply pipe 34. Inkjet head 311 is arranged at a position faced to back-up roll 2 via support 1. Coating-liquid reserved in coating-liquid tank 33 is supplied to inkjet head 311 through coating-liquid supply pipe 34, and is injected to support 1 through nozzle of inkjet head 31. According to this process, coating-liquid is coated on support 1. Coating-liquid is injected, through a nozzle of inkjet head 311 in about center direction of back-up roll 2.

Inkjet head 311 is provided with an inkjet unit 31 in arbitral number and arrangement. The number and arrangement are optionally set according to used coating-liquid, coating condition such as injection width of inkjet head 311 and coating width of support 1.

Coating unit 30 has a function to supply the coating-liquid to inkjet head 311, as well as to maintain constant pressure of coating-liquid in an inkjet head 311.

Inkjet head 311 is not particularly restricted, and includes, for example, a thermal type head which has an exothermic element and coating-liquid is discharged from a nozzle by sudden volume change of the coating-liquid by film boiling due to heat energy from the exothermic element, and a shearing mode type (piezo type) head which has a diaphragm provided with a piezoelectric element in an ink pressure chamber, and coating-liquid is discharged by pressure change in an ink pressure chamber via the diaphragm.

Figure 3:
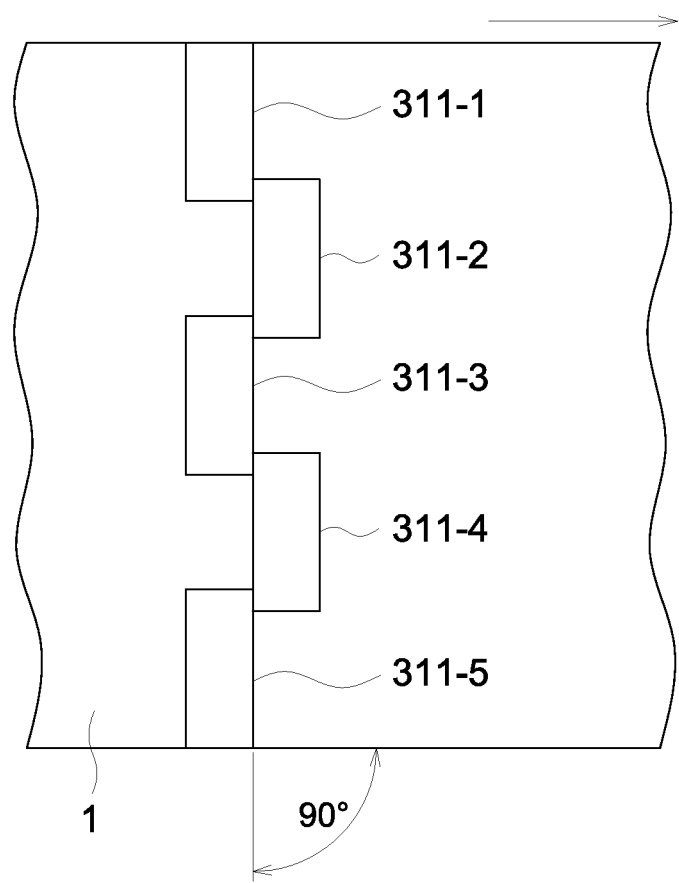
FIG. 3: A schematic plan of an example of the installation arrangement of inkjet head 311 used for the coating apparatus illustrated in FIG. 2.

FIG. 3 is a schematic plan of an installation arrangement of inkjet head 311 used in the coating apparatus shown by FIG. 2.

In FIG. 3, 311-1 to 311-5 show arranged inkjet heads. Inkjet heads 311-1 to 311-5 are arranged so that a face having nozzle discharge opening of each head 311-1 to 311-5 is apparel to coat film face of support 1 and keeping certain distance, and an angle formed by a line of center of nozzle discharge opening arranged in width direction of support 1, which is orthogonal to conveying direction and conveying direction of support 1 satisfies 90°. Further, end portion of each head 311-1 to 311-5 is arranged to superpose staggered so as to eliminate uncoated area between neighboring heads. By employing plural heads and arranging them as shown in this Fig. it is easy to correspond to width of support 1, uncoated area between heads is eliminated, and stable coat film is obtained.

Coaters 11 and 21 and an inkjet head 311 are arranged along with circumference of back-up roll 2 having certain distance.

Coat layer thickness after drying of one layer is not particularly restricted, and it is preferable usually around 5 nm to 5 μm, and further preferably 5 nm to 200 nm.

Coating speed by this method is preferably is 1 m/min. to 10 m/min., and more preferably 1 m/min. to 5 m/min. When the coating speed is 10 m/min. or less, coating is conducted stably and quality defect can be inhibited since the layer thickness after coating and drying is thin. Further, upper layer is coated after dried sufficiently, mixture between layers is difficult to occur and thereby quality defect is also inhibited.

Though a combination of a coater and an inkjet such as two waters and an inkjet are employed in this embodiment, it may be composed of all coaters or all inkjets.

Display Device, Illumination Device

Display device and illumination device applying the organic EL element according to this invention are described. The organic EL element according to this invention may be used as a projection device projecting an image, a display device (displays) observing the still picture image or dynamic picture image directly, or a kind of lamp for such as illumination or exposing source.

EXAMPLE

The present invention is described in terms of examples. The invention is not restricted to these. In the examples, terms of "parts" and "%" are employed, which mean "parts by weight" and "% by weight", respectively. Chemical structures of the charge transportable organic compound according to this invention used in the Examples are shown below.

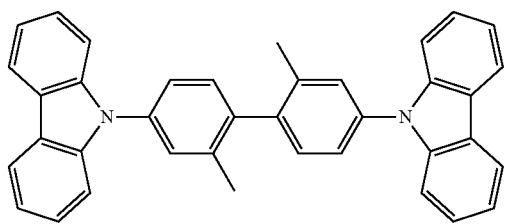

ET-1

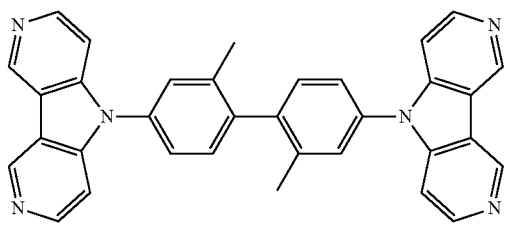

ET-2

-continued

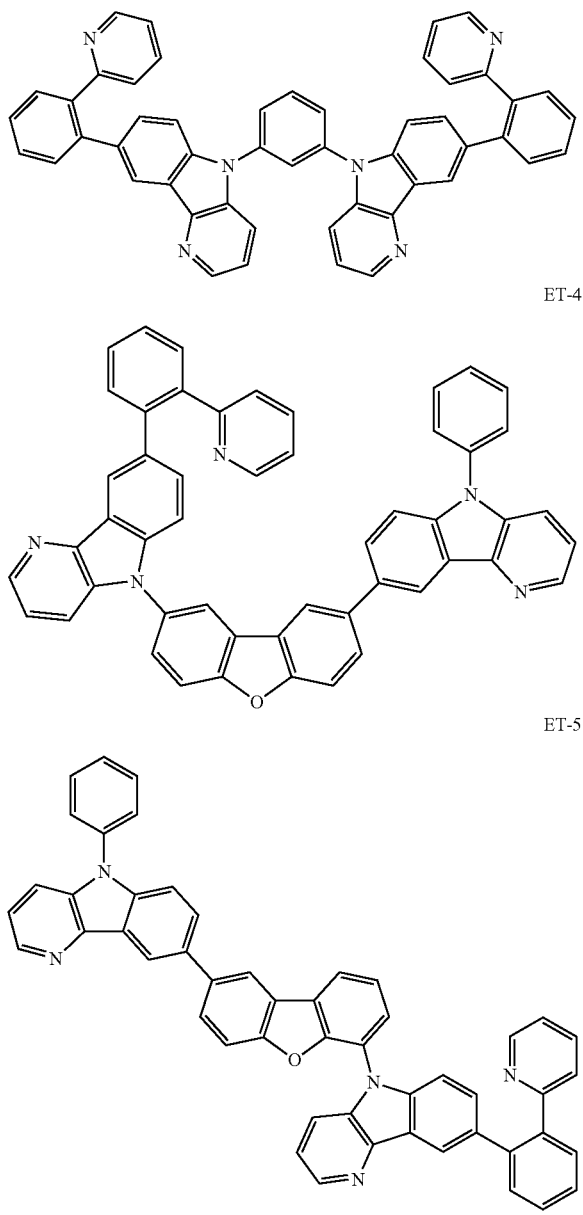

ET-3

ET-4

ET-5

Example 1

Manufacture of Organic EL Element 101

Transparent gas barrier film was formed by atmospheric pressure plasma polymerization method on polyether sulfone (film manufactured by Sumitomo Bakelite Co., Ltd., hereafter abbreviated as PES) having a thickness of 200 μm as an anode.

Next, 120 nm of ITO (indium tin oxide) was formed on this gas barrier film substrate. Roll shape band flexible sheet on which an anode was formed was feed out, and took up in a roll shape after processing by cleaning and surface modification process, charge removing treatment process.

Cleaning and surface modification treatment was conducted by a dry cleaning and surface modification treatment apparatus of low-pressure mercury lamp having wave length of 184.9 nm, irradiation intensity of 15 mW/cm², and irradiation distance of 10 mm.

A static eliminator by faint X-ray was utilized as the charge removing treatment process.

On this substrate, solution of poly(3,4-ethylene dioxy thiophene)-polystyrene sulfonate (PEDOT/PSS, manufactured by Bayer AG, Baytron P Al 4083) diluted by deionized water to 70% by mass was coated via a slot type coater method utilizing a back-up roll having a radius of 3 m at coating speed of 4 m/min., then dried at 200° C. for 1 hour, and a hole injection layer having thickness of 30 nm was provided.

Coating-liquid for a hole transport layer was prepared as described below, and it was coated via a slot type water method utilizing a back-up roll having a radius of 3 m at coating speed of 4 m/min., and a hole transport layer so as to have a thickness after drying of 20 nm was provided.

A hole transport layer was provided by heating this substrate at 150° C. for 30 minutes.

Coating-Liquid for Hole Transport Layer

ADS254BE manufactured by American Dye Source Inc. was dissolve in toluene so as to be 0.5% by mass, and coating-liquid for a hole transport layer was prepared.

Then, coating-liquid for a light emission layer was prepared as described below, and it was coated via a slot type water method utilizing a back-up roll having a radius of 3 m at coating speed of 4 m/min., so as to have a thickness after drying of 50 nm.

Coating-Liquid for Light Emission Layer

H-27 and D-1 were dissolve in butyl acetate so as to be 1% by mass and 0.1% by mass, respectively, and coating-liquid for a light emission layer was prepared.

Immediately after coating of light emission layer, solvent was removed via a drying treatment process by heated air stream. It was conducted from slit nozzle type blowing-out opening to the formed film face at a height of 100 mm, blowing-out rate of 1 m/sec., width distribution of 5%, and drying temperature of 100° C.

Coating-Liquid for Electron Transport Layer

Then, coating-liquid for an electron transport layer was prepared as described below, a first organic layer and a second organic layer were manufactured by conducting coating.

First Organic Layer

In normal butanol, ET-1 (Tg:109° C.) was dissolved so as to have a concentration of 1.0% by mass, coating-liquid for an electron transport layer was prepared. It was coated via a slot type coater method utilizing a back-up roll having a radius of 3 m at coating speed of 4 m/min., so as to have a targeting thickness of 20 nm.

After coating solvent was removed via a drying treatment process by heated air stream. It was conducted from slit nozzle type blowing-out opening to the formed film face at a height of 100 mm, blowing-out rate of 1 m/sec., width distribution of 5%, and drying temperature of 100° C.

Second Organic Layer

After removing solvent, surrounding of coating apparatus was adjusted to 0° C., ET-1 and calcium fluoride was dissolved in normal butanol so as to have 0.9% by mass, and 0.1% by mass, respectively, whereby coating-liquid of an electron transport layer was prepared, then was coated via a slot type coater method utilizing a back-up roll having a radius of 3 m at coating speed of 4 m/min., so as to have a targeting thickness of 20 nm.

A layer thickness of the electron transport layer after coating to solvent removing by drying treatment process using heated air stream was measured by a spectroscopic ellipsometer.

The substrate was adsorbed and conveyed by aspirating gap of closely arranged rolls at a temperature of 150° C., and heating treatment was conducted by heating through back side heat conduction.

Wound-up roll was stored in a container box under reduced pressure ($10^{-6}$ to $10^{-2}$ Pa). The substrate on which up to the electron transport layer was provided, the obtained above described film in roll shape was moved to a vapor deposition apparatus and pressure was reduced to $4 \times 10^{-4}$ Pa. Herein, cesium fluoride and aluminum put in the electrical resistance boats made of tantalum respectively, were equipped to the vapor deposition previously.

A vapor deposition head was set on the electron transport layer, cesium fluoride having thickness of 3 nm as an electron injection layer was formed via vapor deposition.

Subsequently, cathode was provided by vapor deposition of aluminum layer having thickness of 100 nm on the area including organic EL layer area and electrode extracting area.

On an area other than the area for forming electrode of the substrate provided with up to a cathode, inorganic layer such as SiOx, SiNx and composite layer having a thickness of 300 nm was formed as a sealing layer employing a spattering method, plasma CVD method or ion plating method, and was wound up, and Organic EL element 101 was obtained.

Manufacture of Organic EL Elements 102 to 106

Organic EL elements 102 to 106 were manufactured by the same way as the manufacturing method of Organic EL element 101 except that contents of ET-1 and calcium fluoride of the second organic layer were modified as described in Table 1 shown below.

Manufacture of Organic EL Elements 107 to 109

Organic EL elements 107 to 109 were manufactured by the same way as the manufacturing method of Organic EL element 101 except that content of whole organic material in the coating-liquid for the second organic layer was not changed but using coating-liquid in which ET-2 was mixed to ET-1 in a ratio described in Table 1 shown below.

Manufacture of Organic EL Element 201 to 206

Organic EL elements 201 to 206 were manufactured by the same way as the manufacturing method of Organic EL element 105 except that surrounding temperature during coating of coating-liquid for forming the second organic layer was modified as described in Table 2 shown below, respectively.

Manufacture of Organic EL Elements 207 to 212

Organic EL elements 207 to 212 were manufactured by the same way as the manufacturing method of Organic EL element 105 except that, just after forming the first organic layer, solvent was removed via a drying treatment process by heated air stream blowing from slit nozzle type blowing-out opening to the formed film face at a height of 100 mm, blowing-out rate of 1 m/sec., width distribution of 5%, and drying temperature was modified as described in Table 2 shown below.

Manufacture of Organic EL Elements 301 to 304

Organic EL elements 301 to 304 were manufactured by the same way as the manufacturing method of Organic EL element 105 except that, species of charge transportable organic compounds was modified as described in Table 3 shown below, respectively.

Manufacture of Organic EL Elements 401 to 409

Organic EL elements 401 to 409 were manufactured by the same way as the manufacturing method of Organic EL element 105 except that species of metallic compounds was modified as described in Table 4 shown below, respectively.

Manufacture of Organic EL Elements 501 to 508

Organic EL elements 501 to 508 were manufactured by the same way as the manufacturing method of Organic EL element 105 except that species of solvent was modified as described in Table 5 shown below, respectively.

Manufacture of Organic EL Elements 601 to 607

Organic EL elements 601 to 607 were manufactured by the same way as the manufacturing method of Organic EL element 105 except that concentration of solid substance was modified as described in Table 5 shown below, respectively, while content ratio of the organic compound to the metallic compound in the coating-liquid of the second organic layer was maintained.

(Content Ratio of Metallic Compound to Sum of Metallic Compound and Charge Transportable Organic Compound in First Organic Layer)

The manufactured organic EL element calcium ion was detected by employing ADEPT 1010 manufactured by Physical Electronics Inc., with a positive ion detecting condition using $O_2^+$ as the primary ion species and primary ion accelerating voltage of 3 kV, and content ratio (mass ratio) of the metallic compound to sum of the charge transportable organic compound and the metallic compound detected in the first organic layer, that is, (Metallic Compound/(Metallic Compound+organic compound)×100 (Mass %), was obtained by comparing an intensity detected in the second organic layer with an intensity detected in the first organic layer The result was shown in Tables 1 to 6.

Evaluation of Organic EL Element

Film forming property, laminating property and operation stability were evaluated for the manufactured organic EL elements in the following way.

Film Forming Property

Brightness unevenness was measured when constant current of 2.5 mA/cm$^2$ was applied to the manufactured organic EL element. Brightness at a center portion and corners of emission parts of 1 cm×1 cm, the samples were ranked from A to C in accordance with the difference between the highest brightness and lowest brightness as described below. Spectral radiance meter CS-1000 (manufactured by Konica Minolta Sensing Inc.) was used for measuring.

A: Difference between the highest brightness and lowest brightness is not more than 5%.
B: Difference between the highest brightness and lowest brightness is more than 5% and not more than 10%.
C: Difference between the highest brightness and lowest brightness is more than 10%.

Laminating Property

Sum of dry thickness of the first organic layer formed alone and dry thickness of the second organic layer formed alone was compared with the laminated dry thickness of the first organic layer and the second organic layer, and the samples were ranked from A to C in accordance with the difference between the dry thicknesses. Here, each layer thickness was measured by a spectroscopic ellipsometer.

A: Layer thickness difference is not more than 10%.
B: Layer thickness difference is more than 10% and not more than 20%.
C: Layer thickness difference is more than 20%.

Operation Stability

Constant current of 2.5 mA/cm$^2$ was applied to the manufactured organic EL element, operation voltage at the initial stage and operation voltage and after 100 hours were compared, and the samples were ranked from A to C in accordance with the difference.

A: Elevation of voltage is not more than 1.0V.
B: Elevation of voltage is more than 1.0V and not more than 2.0V.
C: Elevation of voltage is more than 2.0V:
The result is shown in Tables 1 to 6.

Charge transportable organic compound is described as organic compound in abbreviation in the following Tables. Solvents TFPO and HFIP in Table 5 refer to 2,2,3,3-tetrafluoro-1-propanol, and 1,1,1,3,3,3-hexafluoro isopropanol, respectively.

TABLE 1

| Organic EL Element | First Organic Layer | | Second Organic Layer | | | | | | | | | |
| | | | Second Organic Layer coating-liquid | | | | | | | | | |
| | | | Solid Substance | | | | | | | | | |
| | | | Organic Compound | | Metallic Compound | | | | | | | |
| | Organic Compound | Drying Process (Heating Process) (°C.) | Species | Added Content (Mass %) | Species | Added Content (Mass %) | Solvent | Solid Substance Concentration (Mass %) | Coating Temperature (°C.) | *1 (Mass %) | Film Forming Property | Laminating Property | Operation Stability |
|---|---|---|---|---|---|---|---|---|---|---|---|---|
| 101 (Comparative Sample) | ET-1 | None | ET-1 | 0.9 | $CaF_2$ | 0.1 | BuOH | 1 | 0 | 0.5 | B | C | C |
| 102 (Inventive Sample) | ET-1 | None | ET-1 | 0.8 | $CaF_2$ | 0.2 | BuOH | 1 | 0 | 1 | A | B | B |
| 103 (Inventive Sample) | ET-1 | None | ET-1 | 0.75 | $CaF_2$ | 0.25 | BuOH | 1 | 0 | 1.6 | A | B | B |
| 104 (Inventive Sample) | ET-1 | None | ET-1 | 0.7 | $CaF_2$ | 0.3 | BuOH | 1 | 0 | 3.4 | A | A | A |
| 105 (Inventive Sample) | ET-1 | None | ET-1 | 0.6 | $CaF_2$ | 0.4 | BuOH | 1 | 0 | 5.5 | B | B | A |
| 106 (Comparative Sample) | ET-1 | None | ET-1 | 0.5 | $CaF_2$ | 0.5 | BuOH | 1 | 0 | 7.9 | C | B | C |
| 107 (Inventive Sample) | ET-1 | None | ET-1:ET-2 = 9:1 | 0.5 | $CaF_2$ | 0.4 | BuOH | 1 | 0 | 7.8 | B | A | B |
| 108 (Inventive Sample) | ET-1 | None | ET-1:ET-2 = 8:2 | 0.5 | $CaF_2$ | 0.4 | BuOH | 1 | 0 | 8.9 | B | A | B |
| 109 (Comparative Sample) | ET-1 | None | ET-1:ET-2 = 7:3 | 0.5 | $CaF_2$ | 0.4 | BuOH | 1 | 0 | 10.9 | C | B | C |

*1: Content ratio of the metallic compound to sum of the charge transportable organic compound and the metallic compound in the first organic layer = {Metallic Compound/(Metallic Compound + Organic Compound)} × 100 (Mass %)

TABLE 2

| Organic EL Element | First Organic Layer | | Second Organic Layer | | | | | | | | | |
| | | | Second Organic Layer coating-liquid | | | | | | | | | |
| | | | Solid Substance | | | | | | | | | |
| | | | Organic Compound | | Metallic Compound | | | | | | | |
| | Organic Compound | Drying Process (Heating Process) (°C.) | Species | Added Content (Mass %) | Species | Added Content (Mass %) | Solvent | Solid Substance Concentration (Mass %) | Coating Temperature (°C.) | *1 (Mass %) | Film Forming Property | Laminating Property | Operation Stability |
|---|---|---|---|---|---|---|---|---|---|---|---|---|
| 105 (Inventive Sample) | ET-1 | None | ET-1 | 0.6 | $CaF_2$ | 0.4 | BuOH | 1 | 0 | 5.5 | B | B | A |
| 201 (Inventive Sample) | ET-1 | None | ET-1 | 0.6 | $CaF_2$ | 0.4 | BuOH | 1 | −20 | 3.1 | B | B | B |
| 202 (Inventive Sample) | ET-1 | None | ET-1 | 0.6 | $CaF_2$ | 0.4 | BuOH | 1 | −10 | 4.4 | B | B | A |
| 203 (Inventive Sample) | ET-1 | None | ET-1 | 0.6 | $CaF_2$ | 0.4 | BuOH | 1 | 5 | 6.6 | A | B | A |
| 204 (Inventive Sample) | ET-1 | None | ET-1 | 0.6 | $CaF_2$ | 0.4 | BuOH | 1 | 10 | 8.1 | A | B | A |
| 205 (Inventive Sample) | ET-1 | None | ET-1 | 0.6 | $CaF_2$ | 0.4 | BuOH | 1 | 15 | 9.9 | A | B | B |
| 206 (Inventive Sample) | ET-1 | None | ET-1 | 0.6 | $CaF_2$ | 0.4 | BuOH | 1 | 20 | 14.6 | C | C | C |

TABLE 2-continued

| Organic EL Element | First Organic Layer | | Second Organic Layer | | | | | | | | | | |
|---|---|---|---|---|---|---|---|---|---|---|---|---|---|
| | | | Second Organic Layer coating-liquid | | | | | | | | | | |
| | | | Solid Substance | | | | | | | | | | |
| | | | Organic Compound | | Metallic Compound | | | | | | | | |
| | Organic Compound | Drying Process (Heating Process) (° C.) | Species | Added Content (Mass %) | Species | Added Content (Mass %) | Solvent | Solid Substance Concentration (Mass %) | Coating Temperature (° C.) | *1 (Mass %) | Film Forming Property | Laminating Property | Operation Stability |
| 207 (Inventive Sample) | ET-1 | Yes (Tg − 30° C.) | ET-1 | 0.6 | CaF$_2$ | 0.4 | BuOH | 1 | 0 | 6.3 | B | B | B |
| 208 (Inventive Sample) | ET-1 | Yes (Tg − 20° C.) | ET-1 | 0.6 | CaF$_2$ | 0.4 | BuOH | 1 | 0 | 7.4 | B | A | B |
| 209 (Inventive Sample) | ET-1 | Yes (Tg − 10° C.) | ET-1 | 0.6 | CaF$_2$ | 0.4 | BuOH | 1 | 0 | 7.7 | B | A | B |
| 210 (Inventive Sample) | ET-1 | Yes (Tg − 5° C.) | ET-1 | 0.6 | CaF$_2$ | 0.4 | BuOH | 1 | 0 | 9.2 | B | A | B |
| 211 (Inventive Sample) | ET-1 | Yes (Tg) | ET-1 | 0.6 | CaF$_2$ | 0.4 | BuOH | 1 | 0 | 11.2 | C | B | B |
| 212 (Inventive Sample) | ET-1 | Yes (Tg + 5° C.) | ET-1 | 0.6 | CaF$_2$ | 0.4 | BuOH | 1 | 0 | 12.5 | C | B | B |

*1: Content ratio of the metallic compound to sum of the charge transportable organic compound and the metallic compound in the first organic layer = {Metallic Compound/(Metallic Compound + Organic Compound)} × 100 (Mass %)

TABLE 3

| Organic EL Element | First Organic Layer | | Second Organic Layer | | | | | | | | | | |
|---|---|---|---|---|---|---|---|---|---|---|---|---|---|
| | | | Second Organic Layer coating-liquid | | | | | | | | | | |
| | | | Solid Substance | | | | | | | | | | |
| | | | Organic Compound | | Metallic Compound | | | | | | | | |
| | Organic Compound | Drying Process (Heating Process) (° C.) | Species | Added Content (Mass %) | Species | Added Content (Mass %) | Solvent | Solid Substance Concentration (Mass %) | Coating Temperature (° C.) | *1 (Mass %) | Film Forming Property | Laminating Property | Operation Stability |
| Example 105 | ET-1 | None | ET-1 | 0.6 | CaF$_2$ | 0.4 | BuOH | 1 | 0 | 5.5 | B | B | A |
| Example 301 | ET-1 | None | ET-2 | 0.6 | CaF$_2$ | 0.4 | BuOH | 1 | 0 | 7.3 | A | B | B |
| Example 302 | ET-1 | None | ET-3 | 0.6 | CaF$_2$ | 0.4 | BuOH | 1 | 0 | 6.3 | A | B | B |
| Example 303 | ET-1 | None | ET-4 | 0.6 | CaF$_2$ | 0.4 | BuOH | 1 | 0 | 5.1 | B | A | A |
| Example 304 | ET-1 | None | ET-5 | 0.6 | CaF$_2$ | 0.4 | BuOH | 1 | 0 | 3.9 | A | A | A |

*1: Content ratio of the metallic compound to sum of the charge transportable organic compound and the metallic compound in the first organic layer = {Metallic Compound/(Metallic Compound + Organic Compound)} × 100 (Mass %)

TABLE 4

| Organic EL Element | First Organic Layer | Second Organic Layer | | | | | | | | | | |
|---|---|---|---|---|---|---|---|---|---|---|---|---|
| | | Second Organic Layer coating-liquid | | | | | | | | | | |
| | | Solid Substance | | | | | | | | | | |
| | | Organic Compound | | Metallic Compound | | | | | | | | |
| | Drying Process (Heating Process) (° C.) | Species | Added Content (Mass %) | Species | Added Content (Mass %) | Solvent | Solid Substance Concentration (Mass %) | Coating Temperature (° C.) | *1 (Mass %) | Film Forming Property | Laminating Property | Operation Stability |
| | Organic Compound | | | | | | | | | | | |
| Example 105 | ET-1 | None | ET-1 | 0.6 | CaF$_2$ | 0.4 | BuOH | 1 | 0 | 5.5 | B | B | A |
| Example 401 | ET-1 | None | ET-1 | 0.6 | KF | 0.4 | BuOH | 1 | 0 | 4.9 | A | B | A |
| Example 402 | ET-1 | None | ET-1 | 0.6 | KBr | 0.4 | BuOH | 1 | 0 | 4.2 | A | B | A |
| Example 403 | ET-1 | None | ET-1 | 0.6 | AcOK | 0.4 | BuOH | 1 | 0 | 5 | A | A | A |
| Example 404 | ET-1 | None | ET-1 | 0.6 | tBuOK | 0.4 | BuOH | 1 | 0 | 4.7 | A | A | A |
| Example 405 | ET-1 | None | ET-1 | 0.6 | AcOCs | 0.4 | BuOH | 1 | 0 | 4.3 | A | A | A |
| Example 406 | ET-1 | None | ET-1 | 0.6 | CsF | 0.4 | BuOH | 1 | 0 | 5.5 | A | B | A |
| Example 407 | ET-1 | None | ET-1 | 0.6 | (AcO)$_2$Ca | 0.4 | BuOH | 1 | 0 | 6.2 | B | B | A |
| Example 408 | ET-1 | None | ET-1 | 0.6 | AlF$_3$ | 0.4 | BuOH | 1 | 0 | 2.1 | B | B | B |
| Example 409 | ET-1 | None | ET-1 | 0.6 | BCl$_3$ | 0.4 | BuOH | 1 | 0 | 9.7 | B | B | B |

*1: Content ratio of the metallic compound to sum of the charge transportable organic compound and the metallic compound in the first organic layer = {Metallic Compound/(Metallic Compound + Organic Compound)} × 100 (Mass %)

TABLE 5

| Organic EL Element | First Organic Layer | Second Organic Layer | | | | | | | | | | |
|---|---|---|---|---|---|---|---|---|---|---|---|---|
| | | Second Organic Layer coating-liquid | | | | | | | | | | |
| | | Solid Substance | | | | | | | | | | |
| | | Organic Compound | | Metallic Compound | | | | | | | | |
| | Drying Process (Heating Process) (° C.) | Species | Added Content (Mass %) | Species | Added Content (Mass %) | Solvent | Solid Substance Concentration (Mass %) | Coating Temperature (° C.) | *1 (Mass %) | Film Forming Property | Laminating Property | Operation Stability |
| | Organic Compound | | | | | | | | | | | |
| Example 105 | ET-1 | None | ET-1 | 0.6 | CaF$_2$ | 0.4 | BuOH | 1 | 0 | 5.5 | B | B | A |
| Example 501 | ET-1 | None | ET-1 | 0.6 | CaF$_2$ | 0.4 | MeOH | 1 | 0 | 8.8 | B | B | A |
| Example 502 | ET-1 | None | ET-2 | 0.6 | CaF$_2$ | 0.4 | EtOH | 1 | 0 | 7.1 | B | B | A |
| Example 503 | ET-1 | None | ET-3 | 0.6 | CaF$_2$ | 0.4 | TFPO | 1 | 0 | 3.9 | B | A | A |
| Example 504 | ET-1 | None | ET-4 | 0.6 | CaF$_2$ | 0.4 | HFIP | 1 | 0 | 4.1 | B | A | A |
| Example 505 | ET-1 | None | ET-1 | 0.6 | CaF$_2$ | 0.4 | Fluorobenzene | 1 | 0 | 7.7 | B | A | B |
| Example 506 | ET-1 | None | ET-2 | 0.6 | CaF$_2$ | 0.4 | Heptane | 1 | 0 | 3.2 | B | B | B |
| Example 507 | ET-1 | None | ET-3 | 0.6 | CaF$_2$ | 0.4 | Decane | 1 | 0 | 3.1 | B | B | B |
| Example 508 | ET-1 | None | ET-4 | 0.6 | CaF$_2$ | 0.4 | Acetonitrile | 1 | 0 | 4 | B | B | B |

*1: Content ratio of the metallic compound to sum of the charge transportable organic compound and the metallic compound in the first organic layer = {Metallic Compound/(Metallic Compound + Organic Compound)} × 100 (Mass %)

TABLE 6

| | First Organic Layer | | Second Organic Layer | | | | | | | | |
|---|---|---|---|---|---|---|---|---|---|---|---|
| | | | Second Organic Layer coating-liquid | | | | | | | | |
| | | | Solid Substance | | | | | | | | |
| | | | Organic Compound | | Metallic Compound | | | | | | | |
| Organic EL Element | Organic Compound | Drying Process (Heating Process) (°C.) | Species | Added Content (Mass %) | Species | Added Content (Mass %) | Solvent | Solid Substance Concentration (Mass %) | Coating Temperature (°C.) | *1 (Mass %) | Film Forming Property | Laminating Property | Operation Stability |
| Example 105 | ET-1 | None | ET-1 | 0.6 | CaF$_2$ | 0.40 | BuOH | 1.00 | 0 | 5.5 | B | B | A |
| Example 601 | ET-1 | None | ET-1 | 0.03 | CaF$_2$ | 0.02 | BuOH | 0.05 | 0 | 5.7 | B | C | B |
| Example 602 | ET-1 | None | ET-1 | 0.06 | CaF$_2$ | 0.04 | BuOH | 0.10 | 0 | 5.6 | B | B | A |
| Example 603 | ET-1 | None | ET-1 | 0.30 | CaF$_2$ | 0.20 | BuOH | 0.50 | 0 | 5.5 | B | A | A |
| Example 604 | ET-1 | None | ET-1 | 0.90 | CaF$_2$ | 0.60 | BuOH | 1.50 | 0 | 5.5 | B | B | A |
| Example 605 | ET-1 | None | ET-1 | 1.80 | CaF$_2$ | 1.20 | BuOH | 3.00 | 0 | 5.4 | B | B | A |
| Example 606 | ET-1 | None | ET-1 | 2.10 | CaF$_2$ | 1.40 | BuOH | 3.50 | 0 | 5.3 | C | B | A |
| Example 607 | ET-1 | None | ET-1 | 2.40 | CaF$_2$ | 1.60 | BuOH | 4.00 | 0 | 5.3 | C | B | B |

*1: Content ratio of the metallic compound to sum of the charge transportable organic compound and the metallic compound in the first organic layer = {Metallic Compound/(Metallic Compound + Organic Compound)} × 100 (Mass %)

The invention as claimed in claim 1 is excellent in film forming property, laminating property and operation stability as apparent from Table 1.

When the content of the metallic compound contained is not more than 40% by mass based on the sum of the content of the charge transportable organic compound and the metallic compound in the second organic layer, laminating property and film forming property are maintained. When the content of the metallic compound contained is less than 20% or more than 40% by mass, film forming property markedly deteriorates as apparent from the organic EL elements 101 to 106.

Further, it is apparent when 80% by mass or more of the charge transportable organic compound in each of the first organic layer and the second organic layer, respectively, is the same compound, sufficient performance is satisfied, however, film forming property and operation stability markedly deteriorated when it is lower than 80% by mass from the organic EL elements 105 and 107 to 109. It is understood that the organic EL element satisfying various performances such as laminating property, film forming property and further operation stability can be manufactured by satisfying every requirements of this invention.

It is preferable the surrounding temperature condition during coating the second organic layer is 5 to 15° C. higher than melting point of a solvent used in the second organic layer coating-liquid, since an element having good laminating property and film forming property as apparent from organic EL elements 105 and 201 to 206 in Table 2 It is understood that laminating property is wrong at high temperature outside of the range. (Further, in a temperature condition of 5° C. higher than the melting point, there is possibility to occur solidifying of coating-liquid, and it is not preferable).

It is understood that laminating property and operation stability are improved by conducting drying process (heating process) after the first organic layer is formed by coating from the organic EL elements 206 and 207 to 212. Further, it is understood that various performances are improved by conducting the drying process in a temperature range of 5° C. lower than Tg to 20° C. lower than Tg.

It is understood that the similar performance is displayed in case that ET-2 and ET-3 other than ET-1 are used as the electron transport material from Table 3. Further, laminating property is further improved by employing ET-4 and ET-5 having a partial structure containing Formula (1) as the electron transport material.

Performance is displayed similar to Example 105 (Inventive Sample) in any elements when various metallic compounds shown in Table 3 as the metallic compound according to the invention are used as shown in Table 4. Further it is understood that, it is particularly preferable to use alkali metal salt in place of alkali earth metal. It is also understood that effect of the object can be obtained by using other metallic compound though not so excellent as one using the metallic compound of alkali metal or alkali earth metal.

It is understood that desired effect is used in case of using any solvents, and higher effect is obtained by using alcoholic solvent or fluorinated alcohol solvent than the other solvents from Table 5. It is apparent that the effect of fluorinated alcohol solvent among them is markedly.

It is understood that advantage of the object is attained independently to solid substance concentration in the second organic layer coating-liquid, however a higher effect is obtained by adjusting second organic layer coating-liquid concentration in the range of 0.1 to 3% by mass from Table 6.

As a result of these, lamination of layers containing the same compound, which is easily manufactured by an evaporation method, is attained by a coating method in the organic electronic devices manufactured according to the invention. Further a manufacturing method improved in operation stability with time of the organic EL element was provided.

The invention claimed is:

1. A manufacturing method of an organic electronic device having a pair of electrodes on a substrate, and at least an organic functional layer and an organic charge transport layer between the electrodes wherein the organic charge transport layer comprises a first organic layer and a second organic layer, which comprises a process for forming a first organic layer by coating, on the organic functional layer, a first organic layer coating-liquid containing a charge transportable organic compound; and a process for forming a second organic layer by coating, on the first organic layer, a second organic layer coating-liquid containing the charge transportable organic compound and a metallic compound, in this order, wherein
- 80% by mass or more of the charge transportable organic compound in each of the first organic layer and the second organic layer, respectively, is the same compound,
- content of the metallic compound contained in the second organic coating-liquid is 20 to 40% by mass based on sum of content of the charge transportable organic compound and content of the metallic compound contained in the second organic layer coating-liquid, and,
- the process for forming a second organic layer by coating the second organic layer coating-liquid is conducted at a temperature of 5 to 15° C. higher than melting point of a solvent used in the second organic layer coating-liquid.

2. The manufacturing method of the organic electronic device of claim 1, wherein drying process is conducted after forming the first organic layer by coating the first organic layer coating-liquid.

3. The manufacturing method of the organic electronic device of claim 2, wherein drying process is heating process at a temperature of 5 to 10° C. lower than a glass transition point of the charge transportable organic compound.

4. The manufacturing method of the organic electronic device of claim 1, wherein the charge transportable organic compound is a compound represented by Formula (1),

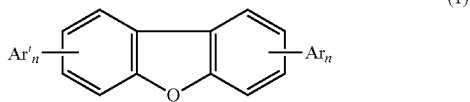

(1)

in Formula (1), Ar and A' represent independently an aromatic ring, and n represents an integer of 0 to 8.

5. The manufacturing method of the organic electronic device of claim 1, wherein the metallic compound is alkali metal salt.

6. The manufacturing method of the organic electronic device of claim 1, wherein the metallic compound is potassium salt.

7. The manufacturing method of the organic electronic device of claim 1, wherein solvent of the first organic layer coating-liquid or the second organic layer coating-liquid is fluorinated alcohol.

8. The manufacturing method of the organic electronic device of claim 1, wherein sum of the content of the organic compound and the metallic compound in the second organic layer coating-liquid is 0.1 to 3.0 mass %.

9. The manufacturing method of the organic electronic device of claim 1, wherein the organic charge transport layer has a concentration gradient of the metallic compound in the thickness direction.

10. The manufacturing method of the organic electronic device of claim 1, wherein the organic charge transport layer is an electron transport layer.

11. The manufacturing method of the organic electronic device of claim 1, wherein the organic functional layer is an organic electroluminescence layer.

12. An organic electronic device manufactured by the manufacturing method of the organic electronic device claim 1.

* * * * *